(12) United States Patent
An et al.

(10) Patent No.: US 11,775,009 B2
(45) Date of Patent: Oct. 3, 2023

(54) DISPLAY MODULE CAPABLE OF RECOGNIZING PEN INPUT DEVICE AND ELECTRONIC DEVICE INCLUDING SAME

(71) Applicant: SAMSUNG ELECTRONICS CO., LTD., Suwon-si (KR)

(72) Inventors: Jungchul An, Suwon-si (KR); Myeongsil Park, Suwon-si (KR); Hyunho Shin, Suwon-si (KR); Shinhyuk Yoon, Suwon-si (KR); Kyungsub Kim, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 51 days.

(21) Appl. No.: 17/585,562

(22) Filed: Jan. 27, 2022

(65) Prior Publication Data
US 2022/0253161 A1   Aug. 11, 2022

Related U.S. Application Data

(63) Continuation of application No. PCT/KR2021/020128, filed on Dec. 29, 2021.

(30) Foreign Application Priority Data

Feb. 8, 2021  (KR) .................. 10-2021-0017410

(51) Int. Cl.
*G06F 1/16*   (2006.01)
*G06F 3/0354*   (2013.01)

(52) U.S. Cl.
CPC ........ *G06F 3/03545* (2013.01); *G06F 1/1616* (2013.01); *G06F 1/1684* (2013.01)

(58) Field of Classification Search
CPC .. G06F 3/03545; G06F 1/1616; G06F 1/1652; G06F 1/1684
See application file for complete search history.

(56) References Cited

U.S. PATENT DOCUMENTS 8,724,301 B2   5/2014  Mahmoud
9,470,404 B2 *  10/2016  Lee .................. G09F 9/301
(Continued)

FOREIGN PATENT DOCUMENTS

KR   10-2019-0124844 A   11/2019
KR   10-2020-0084495 A   7/2020
(Continued)

OTHER PUBLICATIONS

International Search Report dated Mar. 30, 2022 for PCT/KR2021/020128, citing the above reference(s).
(Continued)

*Primary Examiner* — Adrian S Wilson
(74) *Attorney, Agent, or Firm* — CANTOR COLBURN LLP

(57) ABSTRACT

An electronic device includes: a display panel including a first area, a second area, and a third area bendable and between the first area and the second area a first support part under the display panel; a recognition member including a first recognition member under the first area, and a second recognition member spaced apart from the first recognition member and under the second area, where the recognition member is under the first support part and recognizes a signal of a pen input device; a second support part including a first portion under the first recognition member, and a second portion spaced apart from the first portion and under the second recognition member; a first printed circuit board electrically connected to the first portion; and a second printed circuit board spaced apart from the first printed circuit board and electrically connected to the second portion.

20 Claims, 14 Drawing Sheets

(56) References Cited

U.S. PATENT DOCUMENTS

| | | | |
|---|---|---|---|
| 9,720,455 B2* | 8/2017 | Jang | G06F 1/1679 |
| 9,766,737 B2* | 9/2017 | Ahn | G06F 3/04164 |
| 9,952,622 B2* | 4/2018 | Kim | G06F 1/16 |
| 10,495,941 B2 | 12/2019 | Hashimoto et al. | |
| 10,686,028 B2* | 6/2020 | Ahn | G06F 1/1681 |
| 10,736,224 B2* | 8/2020 | Park | E05D 11/06 |
| 10,754,377 B2* | 8/2020 | Siddiqui | H04M 1/0216 |
| 10,775,852 B2* | 9/2020 | Kim | G06F 1/1681 |
| 11,184,980 B2* | 11/2021 | An | G06F 1/1652 |
| 11,513,645 B2 | 11/2022 | Shin et al. | |
| 2012/0002369 A1* | 1/2012 | Wang | G06F 1/1616 |
| | | | 361/752 |
| 2012/0229960 A1* | 9/2012 | Pegg | H04M 1/0218 |
| | | | 361/679.01 |
| 2014/0042293 A1* | 2/2014 | Mok | H04M 1/0216 |
| | | | 248/682 |
| 2014/0126121 A1* | 5/2014 | Griffin | G06F 1/1652 |
| | | | 361/679.01 |
| 2015/0085433 A1* | 3/2015 | Kim | G06F 1/1698 |
| | | | 361/679.01 |
| 2015/0241925 A1* | 8/2015 | Seo | G06F 1/1652 |
| | | | 361/679.27 |
| 2017/0364123 A1* | 12/2017 | Seo | G06F 1/1652 |
| 2018/0077810 A1* | 3/2018 | Moon | H05K 5/0017 |
| 2019/0025887 A1* | 1/2019 | Seo | G06F 1/1652 |
| 2019/0334114 A1 | 10/2019 | Park | |
| 2020/0209998 A1 | 7/2020 | Shin et al. | |
| 2020/0267838 A1 | 8/2020 | An et al. | |
| 2020/0333836 A1 | 10/2020 | Kim et al. | |
| 2022/0043481 A1 | 2/2022 | Shin et al. | |
| 2023/0067179 A1 | 3/2023 | Kim et al. | |

FOREIGN PATENT DOCUMENTS

| | | |
|---|---|---|
| KR | 1020200101116 A | 8/2020 |
| KR | 10-2020-0122688 A | 10/2020 |
| KR | 10-2020-0124099 A | 11/2020 |
| KR | 10-2022-0133917 A | 10/2022 |

OTHER PUBLICATIONS

Written Opinion dated Mar. 30, 2022 for PCT/KR2021/020128, citing the above reference(s).

* cited by examiner

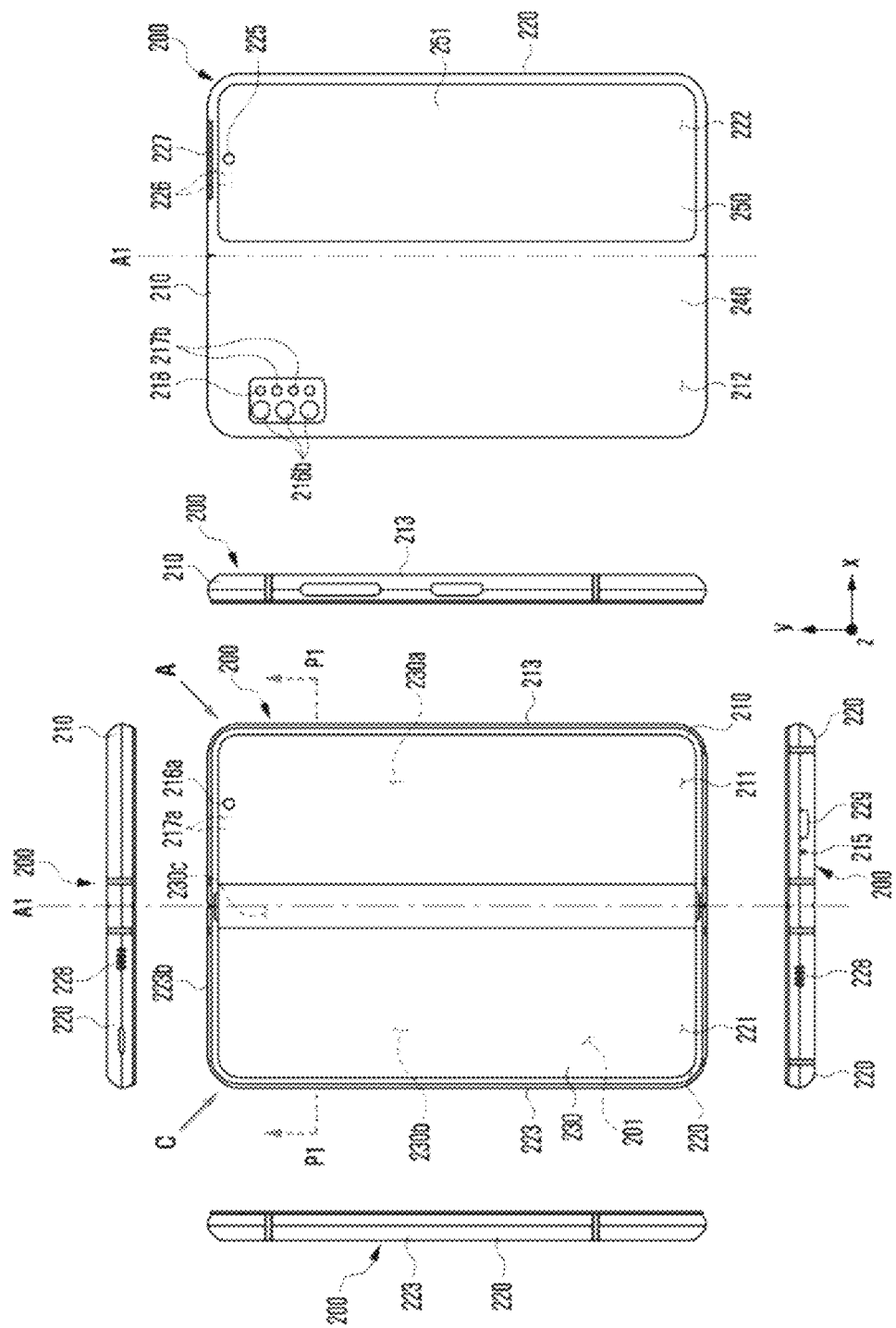

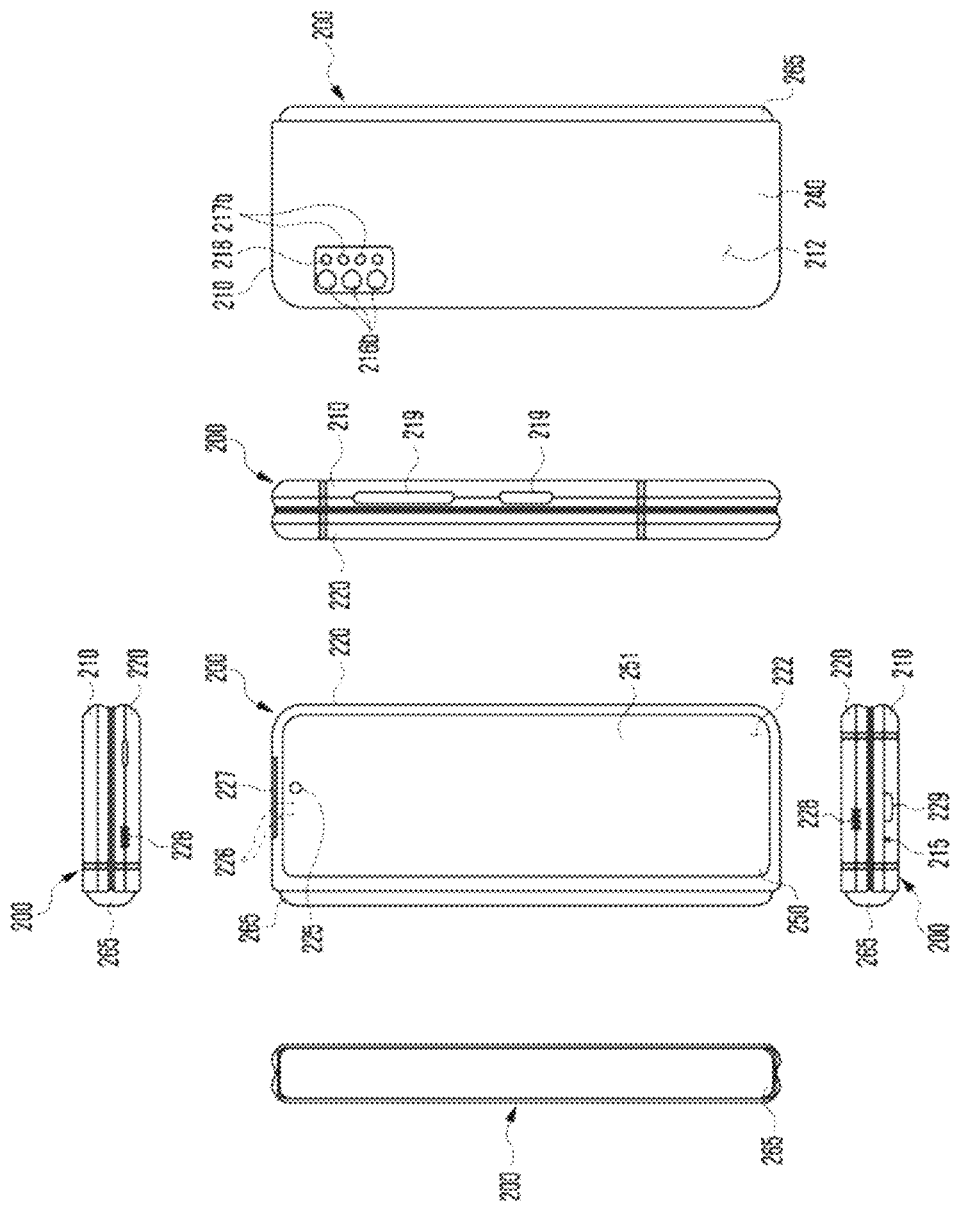

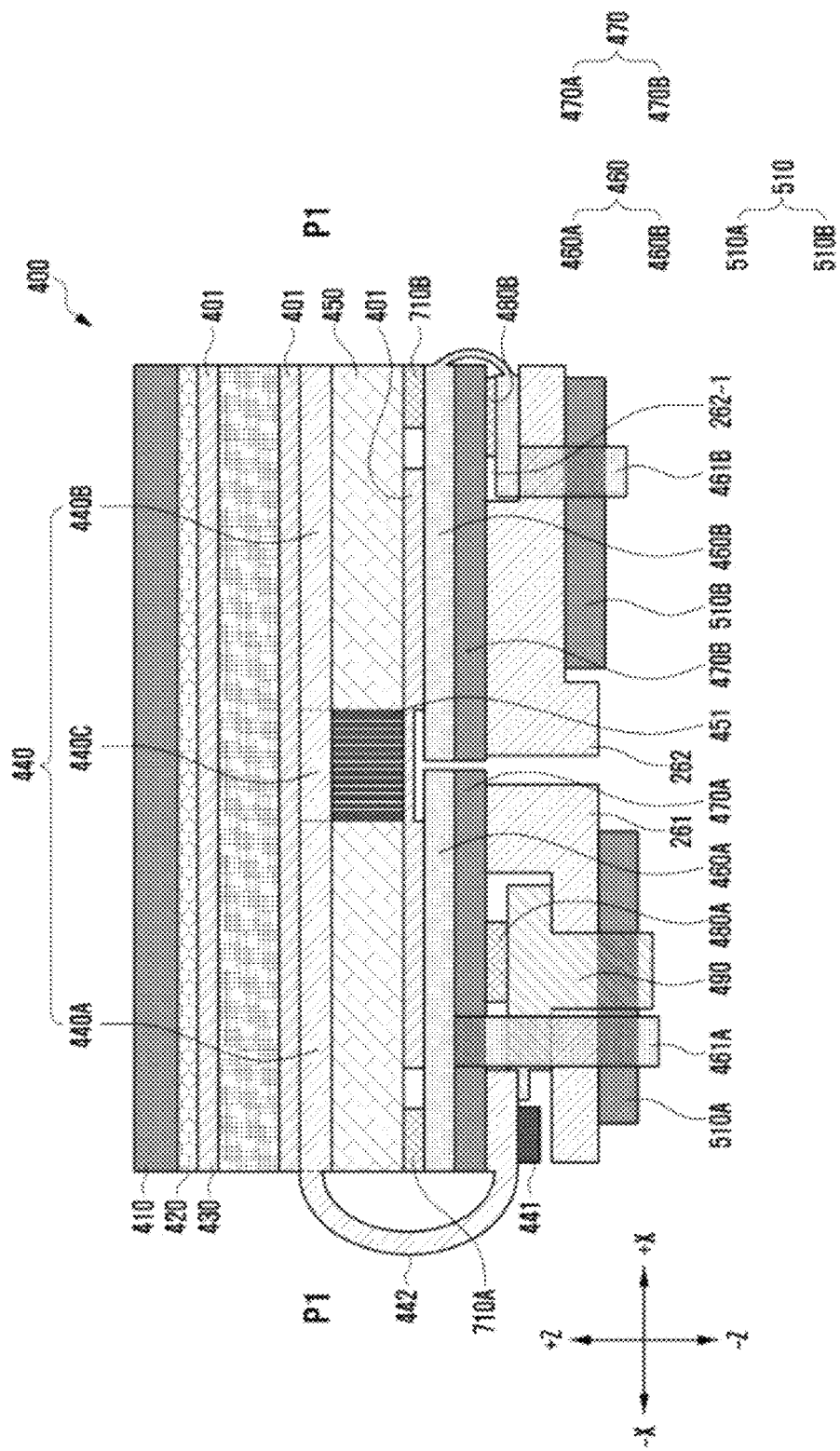

DISPLAY MODULE CAPABLE OF RECOGNIZING PEN INPUT DEVICE AND ELECTRONIC DEVICE INCLUDING SAME

This application is a PCT-Bypass of International Application No. PCT/KR2021/020128, filed on Dec. 29, 2021, which claims priority to Korean Patent Application No. 10-2021-0017410, filed on Feb. 8, 2021, and all the benefits accruing therefrom under 35 U.S.C. § 119, the content of which in its entirety is herein incorporated by reference.

TECHNICAL FIELD

Various embodiments disclosed herein relate to a display module capable of recognizing a pen input device and an electronic device including the display module.

BACKGROUND ART

As more information is desired to be visually displayed on electronic devices and the electronic devices support more functions, demands for electronic devices having larger screen display are increasing. A new type of electronic device for providing a large screen display while maintaining a portable size is also being developed.

With the development of display technology, foldable displays have been implemented. Electronic devices in which such displays are used so that an area capable of displaying information is variable by folding have also been released.

Such an electronic device may support various types of pen input devices. An electronic device may include a display module in which a separate component (e.g., a digitizer) for recognizing an input of a pen input device is included.

DISCLOSURE OF INVENTION

Technical Problem

Recently, a new type of electronic device such as a foldable electronic device is being developed to provide a large-area display while maintaining the size of the electronic device.

A display module of the foldable electronic device may include a plurality of digitizers to recognize an input of a pen input device.

Charges accumulated by the operation of a display module including the digitizers may cause an abnormal flicker phenomenon of the display.

Various embodiments disclosed herein may provide an electronic device including an electrical connection structure between a plurality of digitizers and a ground.

Solution to Problem

An electronic device according to various embodiments disclosed herein includes a first housing, a second housing rotatably connected to the first housing, a display panel including a first area disposed in the first housing, a second area disposed in the second housing, and a third area which connects the first area and the second area and is at least partially bendable, a first support part disposed under the display panel to support the display panel, a recognition member which recognizes a signal of a pen input device, where the recognition member includes a first recognition member disposed in the first housing under the first support part, and a second recognition member disposed in the second housing under the first support part, a second support part including a first portion disposed in the first housing under the recognition member, and a second portion spaced apart from the first portion and disposed in the second housing under the recognition member, a first printed circuit board disposed in the first housing under the second support part, a second printed circuit board disposed in the second housing under the second support part, a connection part electrically connecting the display panel and the first printed circuit board to each other and disposed in the first housing, a first recognition member connection part electrically connecting the first recognition member and the first printed circuit board to each other and disposed in the first housing, a second recognition member connection part electrically connecting the second recognition member and the second printed circuit board and disposed in the second housing, a first contact part disposed between the first portion of the second support part and the connection part to electrically connect the first portion of the second support part and the connection part to each other, and a second contact part disposed between the second portion of the second support part and the second recognition member connection part to electrically connect the second portion of the second support part and the second recognition member connection part to each other.

A display module according to various embodiments disclosed herein includes a display panel including a first area, a second area, and a third area connecting the first area and the second area to each other and at least partially bendable, a first support part disposed under the display panel to support the display panel, a recognition member including a first recognition member disposed under the first support part, and a second recognition member spaced apart from the first recognition member and disposed under the first support part, where the recognition member recognizes a signal of a pen input device, a second support part including a first portion disposed under the recognition member, and a second portion spaced apart from the first portion and disposed under the recognition member, a connection part electrically connecting the display panel and the first printed circuit board, a first recognition member connection part electrically connecting the first recognition member and a first printed circuit board to each other, a second recognition member connection part electrically connecting the second recognition member and a second printed circuit board spaced apart from the first printed circuit board, a first contact part disposed between the first portion of the second support part and the connection part to electrically connect the first portion of the second support part and the connection part to each other, and a second contact part disposed between the second portion of the second support part and the second recognition member connection part to electrically connect the second portion of the second support part and the second recognition member connection part to each other.

Advantageous Effects of Invention

According to various embodiments disclosed herein, various undesired phenomenon (e.g., flicker) due to accumulation of charges in a display module may be reduced since the display module including the digitizers includes a ground connection structure. In such embodiments, the usability of a pen input device may be ensured by securing an area of a component for recognizing the pen input device.

BRIEF DESCRIPTION OF DRAWINGS

In connection with the description of the drawings, the same or similar components may be denoted by the same or similar reference numerals.

FIG. 2A is a diagram illustrating the electronic device in an unfolded state according to various embodiments of the disclosure.

FIG. 2B is a diagram illustrating the electronic device of FIG. 2A in a folded state according to various embodiments of the disclosure.

FIG. 7A is a schematic cross-sectional view of a display module according to various embodiments disclosed herein.

BEST MODE FOR CARRYING OUT THE INVENTION

Figure 1:
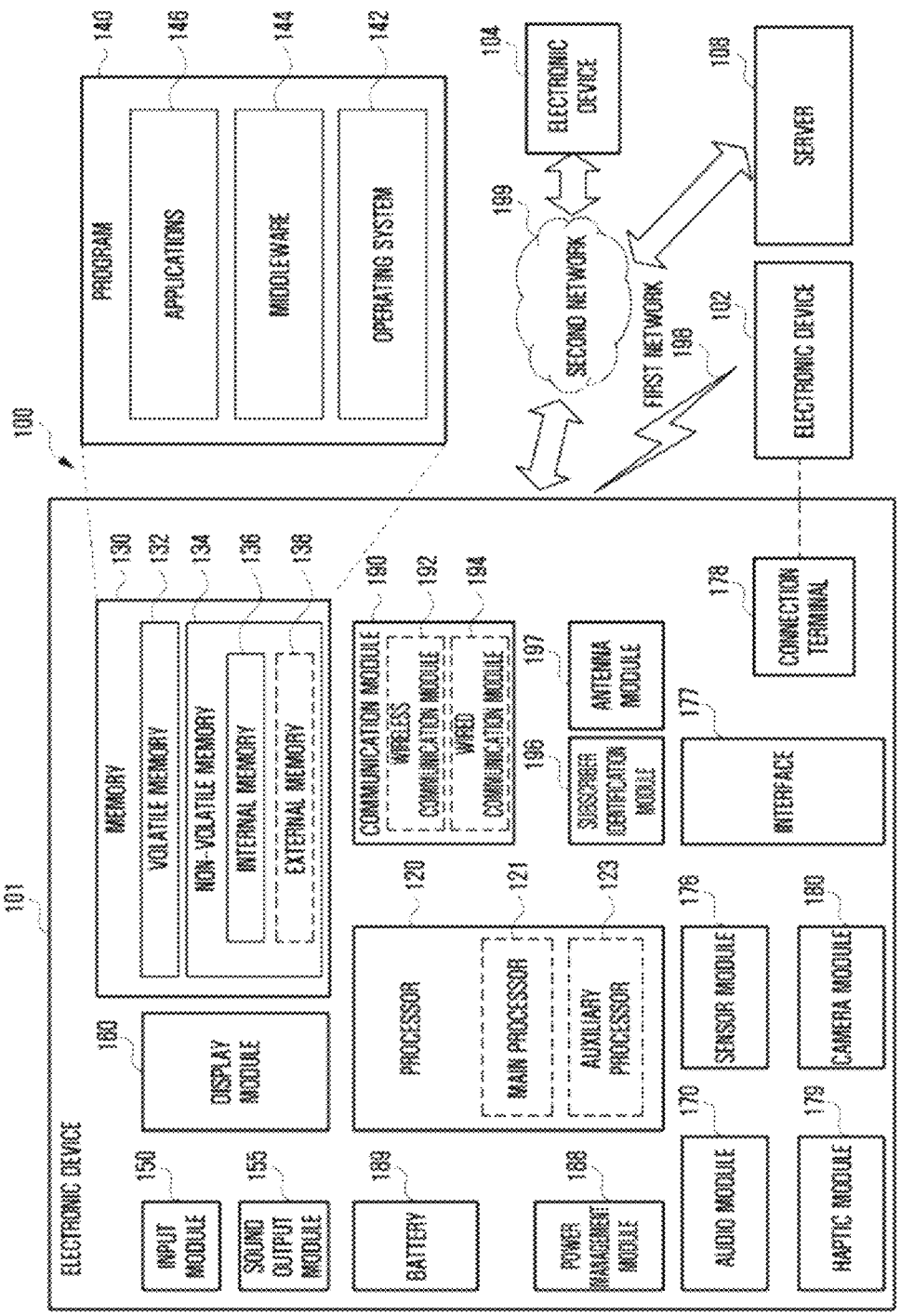
FIG. 1 is a block diagram of an electronic device according to various embodiments in a network environment.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 or an external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The terminology used herein is for the purpose of describing particular embodiments only and is not intended to be limiting. As used herein, "a". "an." "the," and "at least one" do not denote a limitation of quantity, and are intended to include both the singular and plural, unless the context clearly indicates otherwise. For example, "an element" has the same meaning as "at least one element," unless the context clearly indicates otherwise.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

FIG. 2A is a diagram illustrating an electronic device 200 in an unfolded state according to various embodiments. FIG. 2B is a diagram illustrating the electronic device 200 shown in FIG. 2A in a folded state.

Referring to FIGS. 2A and 2B, an embodiment of an electronic device 200 may include a pair of housings 210 and 220 (e.g., foldable housings) rotatably combined with each other based on a folding axis A1 through a hinge device (e.g., a hinge device 264 of FIG. 3) to be folded with the folding axis A1, a first display 230 (e.g., a flexible display, a foldable display, and/or a main display) disposed in the pair of housings 210 and 220, and a second display 251 (e.g., sub-display). According to an embodiment, the hinge device (e.g., the hinge device 264 of FIG. 3) may be disposed not to be seen from an outside through the first housing 210 and the second housing 220 in a folded state, and may be disposed not to be seen from the outside through a hinge cover 265 protecting the hinge device and covering a foldable part in an unfolded state. Herein, a side on which the first display 230 is disposed may be defined as a front side of the electronic device 200, and an opposite side of the front side may be defined as a rear side of the electronic device 200. Further, a side surrounding a space between the front side and the rear side may be defined as a lateral side of the electronic device 200.

Figure 3:
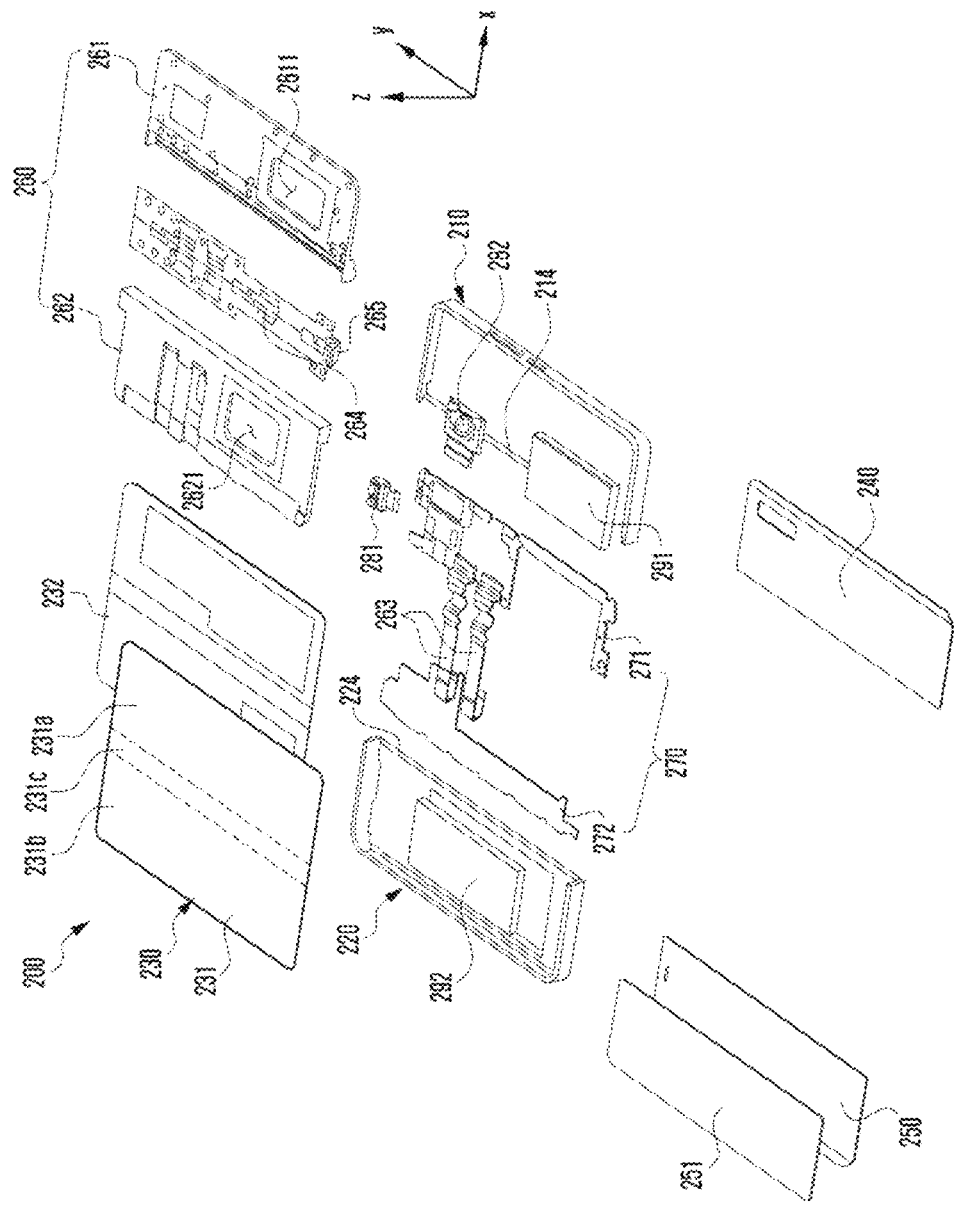
FIG. 3 is an exploded perspective view illustrating the electronic device according to an embodiment of the disclosure.

According to various embodiments, the pair of housings 210 and 220 may include the first housing 210 and the second housing 220 foldably disposed to each other through the hinge device (e.g., the hinge device 264 of FIG. 3). According to an embodiment, the pair of housings 210 and 220 may not be limited to the shape and combination as illustrated in FIGS. 2A and 2B, and may be variously modified to be implemented by a different shape or part combinations and/or association. According to an embodiment, the first housing 210 and the second housing 220 may be disposed on opposing sides around the folding axis A1, and may have a symmetric shape as a whole about the folding axis A1. According to a certain embodiment, for example, the first housing 210 and the second housing 220 may be asymmetrically folded based on the folding axis A1. According to an embodiment, angles or distances between the first housing 210 and the second housing 220 may change depending on whether the electronic device 200 is in an unfolded state, a folded state, or an intermediate state.

According to various embodiments, when the electronic device 200 is in the unfolded state, the first housing 210 may be connected to the hinge device (e.g., hinge device 264 of FIG. 3), and may include a first side 211 disposed to be directed toward the front side of the electronic device 200, a second side 212 directed toward an opposite direction of the first side 211, and a first side member 213 surrounding at least a part of a first space between the first side 211 and the second side 212. According to an embodiment, the second housing 220 may be connected to the hinge device (e.g., hinge device 264 of FIG. 3) in the unfolded state of the electronic device 200, and may include a third side 221 disposed to be directed toward the front side of the electronic device 200, a fourth side 222 directed toward an opposite direction of the third side 221, and a second side member 223 surrounding at least a part of a second space between the third side 221 and the fourth side 222. According to an embodiment, the first side 211 may be directed in a same direction as that of the third side 221 in the unfolded state, and may face the third side 221 in the folded state. According to an embodiment, the electronic device 200 may include a recess 201 defined through structural combination of the first housing 210 and the second housing 220 to accommodate the first display 230. According to an embodiment, the recess 201 may have substantially a same size as that of the first display 230.

According to various embodiments, the hinge cover 265 may be disposed between the first housing 210 and the second housing 220 to cover the hinge device (e.g., hinge device 264 of FIG. 3). According to an embodiment, the hinge cover 265 may be hidden or exposed to an outside by parts of the first housing 210 and the second housing 220 depending on the unfolded state, the folded state, or the intermediate state of the electronic device 200. In an embodiment, for example, in the unfolded state of the electronic device 200, the hinge cover 265 may be hidden by the first housing 210 and the second housing 220, and may not be exposed. According to an embodiment, in case that the electronic device 200 is in the folded state, the hinge cover 265 may be exposed to the outside between the first housing 210 and the second housing 220. According to an embodiment, when the electronic device 200 is in the intermediate state where the first housing 210 and the second housing 220 are folded with a certain angle, the hinge cover 265 may be at least partly exposed to the outside of the electronic device 200 between the first housing 210 and the second housing 220. In an embodiment, for example, an area in which the hinge cover 265 is exposed to the outside may be smaller than that in a completely folded state. According to an embodiment, the hinge cover 265 may include a curved side.

According to various embodiments, when the electronic device 200 is in the unfolded state (e.g., state of FIG. 2A), the first housing 210 and the second housing 220 form an angle of about 280 degrees, and a first area 230a, a folding area 230c, and a second area 230b of the first display 230 may be disposed to form a plane and to be directed in a same direction as each other. In another embodiment, in the unfolded state of the electronic device 200, the first housing 210 may be rotated at an angle of 360 degrees against the second housing 220, and may be reversely folded in a way such that the second side 212 and the fourth side 222 face each other (out folding type).

According to various embodiments, when the electronic device 200 is in the folded state (e.g., state of FIG. 2B), the first side 211 of the first housing 210 and the third side 221 of the second housing 220 may be disposed to face each other. In this case, the first area 230a and the second area 230b of the first display 230 may form a narrow angle (e.g., in the range of 0 to 10 degrees) with each other through the folding area 230c, and may be disposed to face each other. According to an embodiment, at least a part of the folding area 230c may be formed as a curved side having a certain radius of curvature. According to an embodiment, when the electronic device 200 is in the intermediate state, the first housing 210 and the second housing 220 may be disposed with a certain angle. In this case, the first area 230a and the second area 230b of the first display 230 may form an angle that is larger than the angle in the folded state and smaller than the angle in the unfolded state, and the radius of curvature of the folding area 230c may be larger than that in the folded state. In a certain embodiment, the first housing 210 and the second housing 220 may form a designated folding angle at which folding between the folded state and the unfolded state is stopped through the hinge device (e.g., the hinge device 264 of FIG. 3) (free stop function). In a certain embodiment, the first housing 210 and the second housing 220 may operate as being pressed in a folding direction or in an unfolding direction based on a designated inflection angle through the hinge device (e.g., the hinge device 264 of FIG. 3).

According to various embodiments, the electronic device 200 may include at least one of displays 230 and 251 disposed on the first housing 210 and/or the second housing 220, an input device 215, sound output devices 227 and 228, sensor modules 217a, 217b, and 226, camera modules 216a, 216b, and 225, a key input device 219, an indicator (not illustrated), or a connector port 229. In a certain embodiment, the electronic device 200 may omit at least one of constituent elements, or may additionally include at least one of other constituent elements.

According to various embodiments, the at least one display 230 and 251 may include the first display 230 (e.g., flexible display) disposed to be supported by the third side 221 of the second housing 220 through the hinge device (e.g., hinge device 264 of FIG. 3) from the first side 211 of the first housing 210, and the second display 251 disposed to be seen from the outside through the fourth side 222 in the inner space of the second housing 220. According to an embodiment, the first display 230 may be mainly used in the unfolded state of the electronic device 200, and the second display 251 may be mainly used in the folded state of the electronic device 200. According to an embodiment, when the electronic device 200 is in the intermediate state, the first display 230 or the second display 251 may be used or operate based on the folding angle of the first housing 210 and the second housing 220.

According to various embodiments, the first display 230 may be disposed in a space formed by the pair of housings 210 and 220. In an embodiment, for example, the first display 230 may be seated in a recess 201 formed by the pair of housings 210 and 220, and may be disposed to occupy substantially most of the front side of the electronic device 200. According to an embodiment, the first display 230 may include the flexible display of which at least a partial area may be transformed into a planar or curved side. According to an embodiment, the first display 230 may include the first area 230a facing the first housing 210, the second area 230b facing the second housing 220, and the folding area 230c connecting the first area 230a and the second area 230b, and facing the hinge device (e.g., the hinge device 264 of FIG. 3). According to an embodiment, the area division of the first display 230 is merely an imaginary division by a pair of housings 210 and 220 and the hinge device (e.g., hinge device 264 of FIG. 3), and the first display 230 may substantially display one seamless full screen through the pair of housings 210 and 220 and the hinge device (e.g., hinge device 264 of FIG. 3). According to an embodiment, the first area 230a and the second area 230b may have a symmetric shape as a whole based on the folding area 230c, or may have a partly asymmetric shape.

According to various embodiments, the electronic device 200 may include a first rear cover 240 disposed on the second side 212 of the first housing 210, and a second rear cover 250 disposed on the fourth side 222 of the second housing 220. In a certain embodiment, at least a part of the first rear cover 240 may be integrally formed as a single unitary body with the first side member 213. In a certain embodiment, at least a part of the second rear cover 250 may be integrally formed as a single unitary body with the second side member 223. According to an embodiment, at least one of the first rear cover 240 and the second rear cover 250 may be formed through (or defined by) a substantially transparent plate (e.g., glass plate including various coating layers or polymer plate) or an opaque plate. According to an embodiment, the first rear cover 240 may be formed through the opaque plate, such as coated or colored glass, ceramic, polymer, metal (e.g., aluminum, stainless steel (STS), or magnesium), or a combination of at least two of the above materials. According to an embodiment, the second rear cover 250 may be formed through a substantially transparent plate, such as glass or polymer. Accordingly, the second display 251 may be disposed to be seen from the outside through the second rear cover 250 in the inner space of the second housing 220.

According to various embodiments, the input device 215 may include a microphone 215. In a certain embodiment, the input device 215 may include a plurality of microphones 215 that detects the direction of sound. According to an embodiment, the sound output devices 227 and 228 may include speakers 227 and 228. According to an embodiment, the speakers 227 and 228 may include a call receiver 227 disposed through the fourth side 222 of the second housing 220 and an external speaker 228 disposed through the side member of the second housing 220. In a certain embodiment, the microphone 215, the speakers 227 and 228, and the connector port 229 may be disposed in the spaces of the first housing 210 and/or the second housing 220, and may be exposed to an external environment through at least one hole formed in (or defined in) the first housing 210 and/or the second housing 220. In a certain embodiment, the holes formed in the first housing 210 and/or the second housing 220 may be commonly used for the microphone 215 and the speakers 227 and 228. In a certain embodiment, where the holes formed in the first housing 210 and/or the second housing 220 are omitted, the sound output devices 227 and 228 may include a speaker (e.g., piezo-electric speaker).

According to various embodiments, the camera modules 216a, 216b, and 225 may include the first camera device 216a disposed on the first side 211 of the first housing 210, the second camera device 216b disposed on the second side 212 of the first housing 210, and/or the third camera device 225 disposed on the fourth side 222 of the second housing 220. According to an embodiment, the electronic device 200 may include a flash 218 disposed near the second camera device 216b. According to an embodiment, the flash 218 may include, for example, a light emitting diode or a xenon lamp. According to an embodiment, the camera devices 216a, 216b, and 225 may include one or a plurality of lenses, an image sensor, and/or an image signal processor. In a certain embodiment, at least one of the camera devices 216a, 216b, and 225 may include two or more lenses (wide-angle lens and telephoto lens) and image sensors, and may be disposed together on any one side of the first housing 210 and/or the second housing 220.

According to various embodiments, the sensor modules 217a, 217b, and 226 may generate electrical signals or data values corresponding to an internal operation state of the electronic device 200 or an external environment state. According to an embodiment, the sensor modules 217a, 217b, and 226 may include the first sensor module 217a disposed on the first side 211 of the first housing 210, the second sensor module 217b disposed on the second side 212 of the first housing 210, and/or the third sensor module 226 disposed on the fourth side 222 of the second housing 220. In a certain embodiment, the sensor modules 217a, 217b, and 226 may include at least one of a gesture sensor, a grip sensor, a color sensor, an infrared (IR) sensor, an illuminance sensor, an ultrasonic sensor, an iris recognition sensor, or a distance detection sensor (TOF sensor or RiDAR scanner).

According to various embodiments, the electronic device 200 may further include at least one of other sensor modules (not shown), for example, a barometric pressure sensor, a magnetic sensor, a biosensor, a temperature sensor, a humidity sensor, or a fingerprint recognition sensor. In a certain embodiment, the fingerprint recognition sensor may be disposed through at least one of the first side member 213 of the first housing 210 and/or the second side member 223 of the second housing 220.

According to various embodiments, the key input device 219 may be disposed to be exposed to the outside through the first side member 213 of the first housing 210. In a certain embodiment, the key input device 219 may be disposed to be exposed to the outside through the second side member 223 of the second housing 220. In a certain embodiment, the electronic device 200 may not include parts or all of the above-mentioned key input devices 219, and the key input device 219 that is not included may be implemented in other forms, such as a soft key, on the at least one display 230 and 251. In another embodiment, the key input device 219 may be implemented using a pressure sensor included in the at least one display 230 and 251.

According to various embodiments, the connector port 229 may accommodate connectors (e.g., USB connector or interface connector port (IF) module) for transmitting or receiving a power and/or data to or from an external electronic device. In a certain embodiment, the connector port 229 may perform a function for transmitting or receiving an audio signal to or from the external electronic device together, or may further include a separate connector port (e.g., ear-jack hole) for performing audio signal transmission/reception.

According to various embodiments, at least one camera device 216a and 225 among the camera devices 216a, 216b, and 225, at least one sensor module 217a and 226 among the sensor modules 217a, 217b, and 226, and/or the indicator may be disposed to be exposed through the at least one display 230 and 251. In an embodiment, for example, the at least one camera device 216a and 225, the at least one sensor module 217a and 226, and/or the indicator may be disposed under a display area of the displays 230 and 251 in the inner space of the at least one housing 210 and 220, and may be disposed to come in contact with the external environment through an opening perforated up to the cover member (e.g., window layer (not illustrated) of the first display 230 and/or the second rear cover 250). In another embodiment, some camera devices or sensor module 204 may be disposed to perform their functions without being visually exposed through the display. In an embodiment, for example, the area of the display 230 or 251 (e.g., display panel), which faces the camera device and/or the sensor module, may not include the perforated opening.

According to various embodiments, the electronic device 200 may include at least one antenna composed through at least one part of the first conductive side member 213 of the first housing 210.

In an embodiment, for example, at least one antenna is additionally implemented through the second conductive side member 223 of the second housing 220 including the second display 251.

FIG. 3 is an exploded perspective view of an electronic device 200 according to various embodiments of the disclosure.

Referring to FIG. 3, an embodiment of the electronic device 200 may include the first display 230, the second display 251, a support member assembly 260, at least one printed circuit board 270, the first housing 210, the second housing 220, the first rear cover 240, and the second rear cover 250.

According to various embodiments, the first display 230 may include a display panel 231 (e.g., flexible display panel), and one or more plates 232 or layers on which the display panel 231 (e.g., flexible display panel) is seated. According to an embodiment, the one or more plates 232 may include a conductive plate (e.g., Cu sheet or SUS sheet) disposed between the display panel 231 and the support member assembly 260. According to an embodiment, the one or more plates 232 may be formed to have substantially a same area as that of the first display 230, and the area facing the folding area 230c of the first display 230c may be bendably formed. According to an embodiment, the one or more plates 232 may include at least one subsidiary material layer (e.g., graphite member) disposed on the rear side of the display panel 231. According to an embodiment, the one or more plates 232 may be formed in the shape corresponding to the display panel 231.

According to various embodiments, the second display 251 may be disposed in a space between the second housing 220 and the second rear cover 250. According to an embodiment, the second display 251 may be disposed to be seen from the outside through substantially the total area of the second rear cover 250 in the space between the second housing 220 and the second rear cover 250.

According to various embodiments, the support member assembly 260 may include a first support member 261 (e.g., a first support plate), a second support member 262 (e.g., a second support plate), the hinge device 264 disposed between the first support member 261 and the second support member 262, the hinge cover 265 covering the hinge device 264 as seen from the outside of the hinge device 264, and at least one wiring member 263 (e.g., a flexible printed circuit board (FPCB)) crossing the first support member 261 and the second support member 262. According to an embodiment, the support member assembly 260 may be disposed between the one or more plates 232 and the at least one printed circuit board 270. According to an embodiment, the first support member 261 may be disposed between the first area (or a first flat portion) 231a of the first display 230 and a first printed circuit board 271. According to an embodiment, the second support member 262 may be disposed between the second area (or a second flat portion) 231b of the first display 230 and a second printed circuit board 272. According to an embodiment, the folding area (or a folding portion) 231c of the first display 230 may be disposed between the first area 231a and the second area 231b. According to an embodiment, inside the support member assembly 260, the at least one wiring member 263 and at least a part of the hinge device 264 may be disposed. The at least one wiring member 263 may be disposed in a direction (e.g., x-axis direction) crossing the first support member 261 and the second support member 262. According to an embodiment, the at least one wiring member 263 may be disposed in a direction (e.g., x-axis direction) that is vertical to the folding axis (e.g., y axis or folding axis A of FIG. 2A) of the folding area 230c.

According to various embodiments, the at least one printed circuit board 270 may include the first printed circuit board 271 disposed to face the first support member 261 and the second printed circuit board 272 disposed to face the second support member 262. According to an embodiment, the first printed circuit board 271 and the second printed circuit board 272 may be disposed in the inner space that is formed by the support member assembly 260, the first housing 210, the second housing 220, the first rear cover 240, and/or the second rear cover 250. According to an embodiment, the first printed circuit board 271 and the second printed circuit board 272 may include a plurality of electronic components disposed to implement various functions of the electronic device 200.

According to various embodiments, the first space of the first housing 210 may accommodate the first printed circuit board 271 disposed in the space formed through the first support member 261, a first battery 291 disposed at a location facing a first swelling hole 2611 of the first support member 261, at least one camera device 282 (e.g., first camera device 216a of FIG. 2A and/or second camera device 216b), or at least one sensor module 281 (e.g., first sensor module 217a of FIG. 2A and/or second sensor module 217b). According to an embodiment, the second space of the second housing 220 may accommodate the second printed circuit board 272 disposed in the second space formed through the second support member 262, and a second battery 292 disposed at a location facing a second swelling hole 2621 of the second support member 262. According to an embodiment, the first housing 210 and the first support member 261 may be integrally formed with each other as a single unitary body. According to an embodiment, the second housing 220 and the second support member 262 may also be integrally formed with each other as a single unitary body.

According to various embodiments, the first housing 210 may include a first rotation support side 214, and the second housing 220 may include a second rotation support side 224 corresponding to the first rotation support side 214. According to an embodiment, the first rotation support side 214 and the second rotation support side 224 may include a curved side corresponding (naturally connected) to a curved side included in the hinge cover 265. According to an embodiment, when the electronic device 200 is in the unfolded state, the first rotation support side 214 and the second rotation support side 224 may cover the hinge cover 265, and may not expose the hinge cover 265 to the rear side of the electronic device 200, or may minimally expose the hinge cover 265. According to an embodiment, when the electronic device 200 is in the folded state, the first rotation support side 214 and the second rotation support side 224 may be rotated along the curved side included in the hinge cover 265, and may expose the hinge cover 265 to the rear side of the electronic device 200.

An embodiment of an electronic device described below may correspond to the electronic device 101 of FIG. 1 or the electronic device 200 of FIG. 2A. Although not separately mentioned in the following description, the electronic device may include at least one of the components described with reference to FIG. 1 and the components described with reference to FIGS. 2A, 2B, and 3. The layout of the electronic device illustrated in FIGS. 2A, 2B, and 3 is merely an example for describing the disclosure, and is not intended to limit the external appearance or structure of the electronic device described in the disclosure.

Figure 4A:
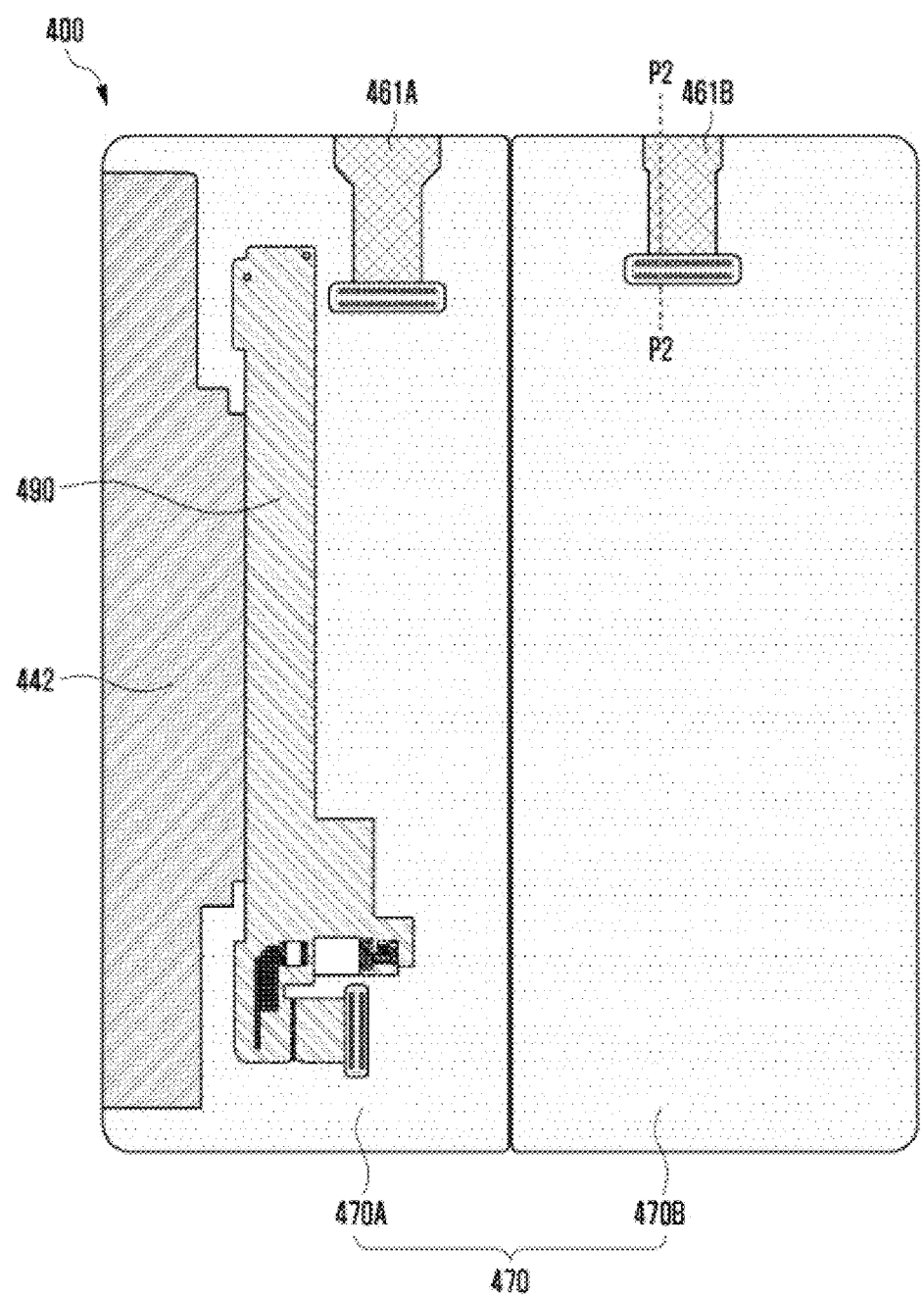
FIG. 4A is a rear view of a display module according to various embodiments disclosed herein.
Figure 4B:
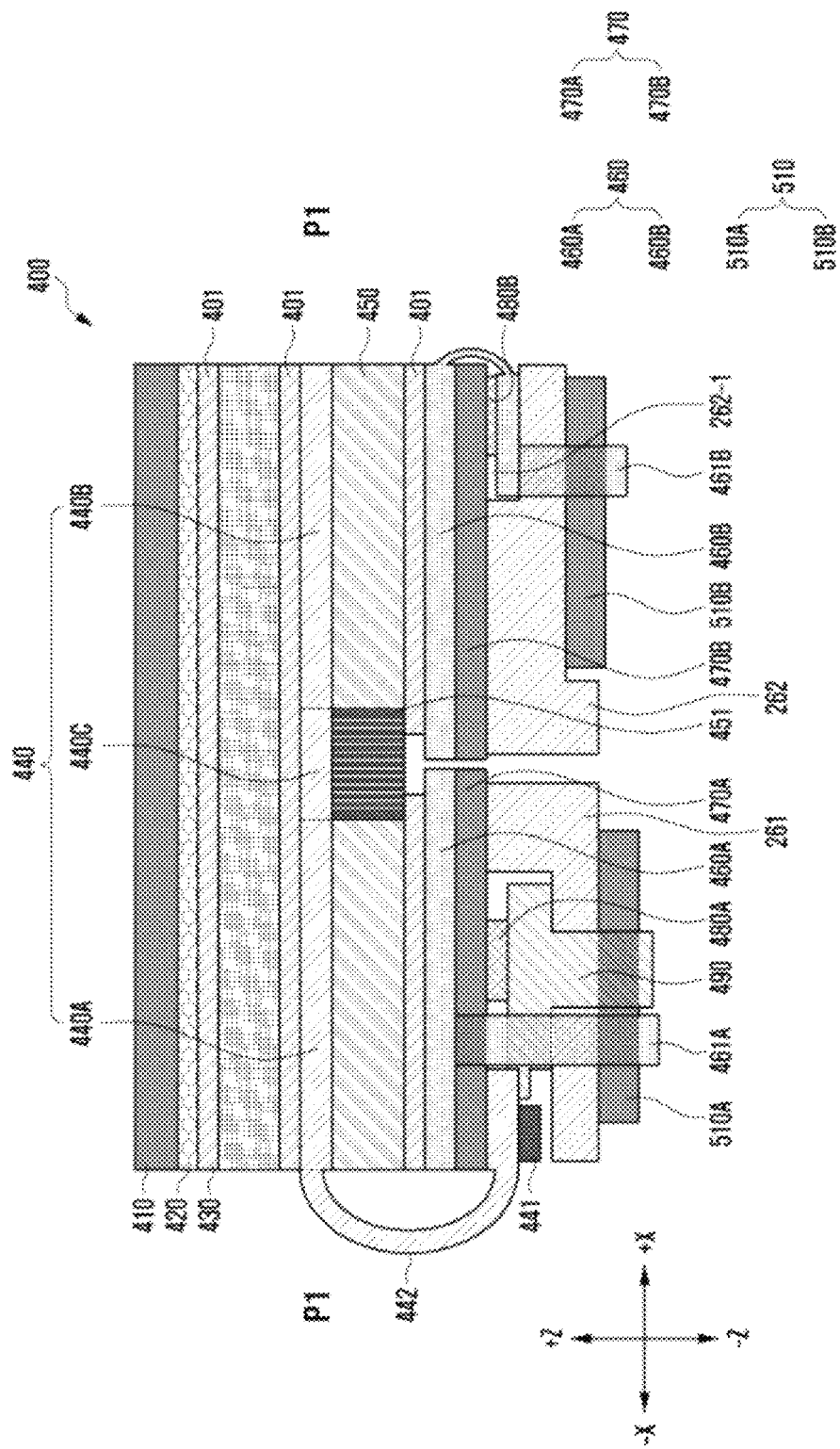
FIG. 4B is a schematic cross-sectional view of the electronic device taken along line P1-P1 in FIG. 2A.
Figure 4C:
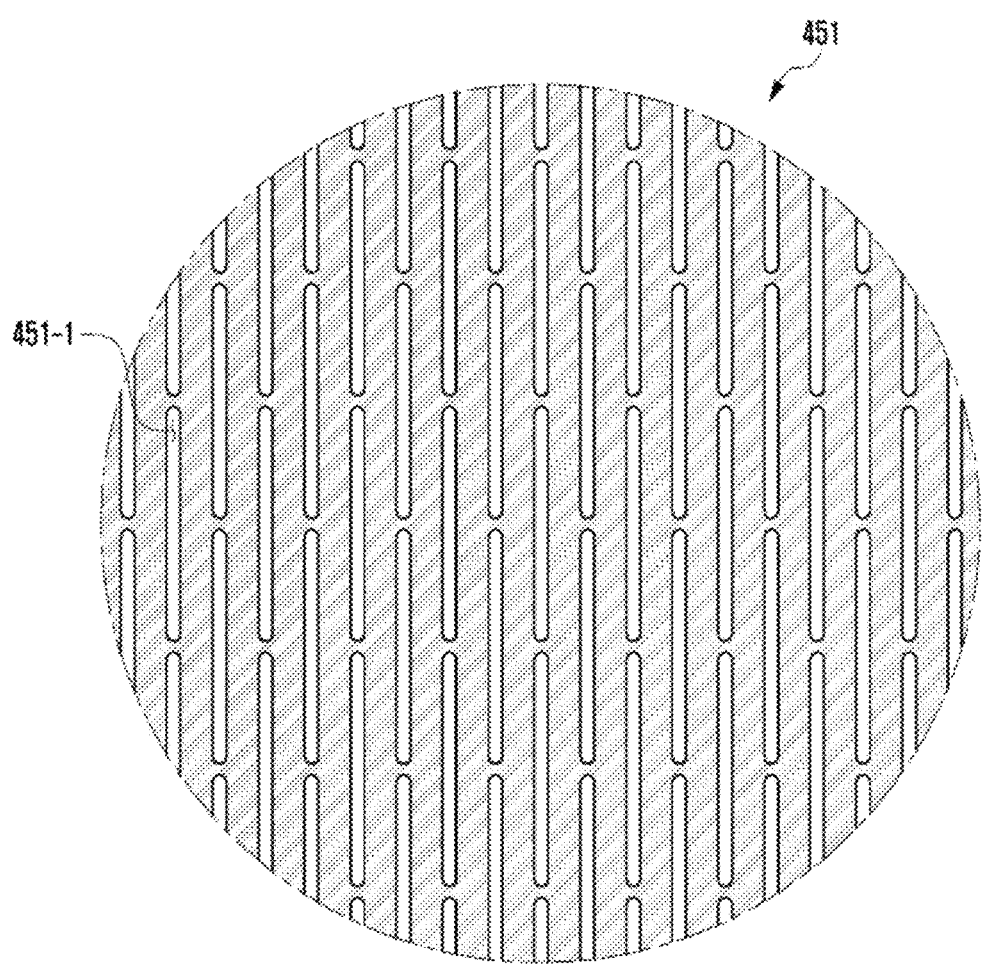
FIG. 4C is a view illustrating a portion of the flexible connection part illustrated in FIG. 4A.

FIG. 4A is a rear view of a display module according to various embodiments disclosed herein. FIG. 4B is a schematic cross-sectional view of the electronic device taken along line P1-P1 in FIG. 2A. FIG. 4C is a view illustrating a portion of the flexible connection part illustrated in FIG. 4A. Hereinafter, a housing will be described in detail with reference to FIGS. 2A, 2B, and 3.

According to various embodiments, the electronic device may include a first housing and a second housing. At least a part of the first housing and the second housing may form an external appearance of the electronic device. The first housing and the second housing may be components that support various electronic components or mechanical components included in the electronic device.

In an embodiment, the first housing and the second housing may be rotatably connected to each other. In an embodiment, for example, the second housing may be rotatably connected to the first housing by a hinge structure. In an embodiment, for example, similar to the electronic device illustrated in FIGS. 2A, 2B and 3, an electronic device may be in a folded state (e.g., FIG. 2B), an unfolded state (e.g., FIG. 2B), or an intermediate state (e.g., a state in which the first housing and the second housing form a predetermined angle) according to the rotation of the second housing relative to the first housing.

The first and second housings described above may correspond to the first housing 210 and the second housing 220 illustrated in FIG. 3. Since the first housing and the second housing are segmented from each other and rotatably connected to each other, the first housing may be understood as the second housing 220 of FIG. 3, and the second housing may be understood as the first housing 210 of FIG. 3. In the following description, reference numbers of the first housing 210 and the second housing 220 of FIG. 3 will be used for the first housing and the second housing.

According to various embodiments, the electronic device may include a display module 400 (e.g., the first display 230 in FIG. 3) that visually displays information. Here, a module may mean at least one electronic component and/or a mechanical component for performing at least one function or a function related to the function. Since the module is merely classified for convenience of description, it is not construed as limiting that various components belonging to a certain module are all physically and electrically connected to each other. For example, even electronic components physically separated from each other may be considered as components belonging to a specific module for convenience of description, and even electronic components performing different functions may be included in the same module.

According to various embodiments, the display module 400 may include a structure in which a plurality of layers are stacked. In an embodiment, for example, as illustrated in FIG. 4B, the display module 400 may have a structure in which a protective layer 410, a glass layer 420, a polarization layer 430, a display panel 440, a first support part 450, a recognition member 460, or a second support part 470 are stacked one on another. In an embodiment, an adhesive layer 401 may be disposed between the layers to fix the relative positions of the layers. In an embodiment, for example, as illustrated in FIG. 4B, the adhesive layer 401 may be disposed between the glass layer 420 and the polarization layer 430, between the polarization layer 430 and the display panel 440, or between the first support part 450 and the recognition member 460. In an embodiment, the adhesive layer 401 may include or be formed of a synthetic resin material having an adhesive property. In an embodiment, for example, the adhesive layer 401 may include or be formed of a light-curable adhesive material. The structure of one embodiment of the display module 400 is described above, and the display module 400 may include layers other than those described above, and one or more of the layers described above may be omitted. In another embodiment, the stacking order of the layers may be changed and the adhesive layer 401 may also be disposed at a position different from those described above.

According to various embodiments, the protective layer 410 may be a layer for protecting the glass layer 420. In an embodiment, for example, the protective layer 410 may be a film at least partially formed of a transparent material. In an embodiment, various coatings may be applied to the protective layer 410 to assist the optical performance of the display module 400.

According to various embodiments, the glass layer 420 may be a layer including or formed of a glass material. In an embodiment, for example, the glass layer 420 may include very thin glass (e.g., ultra-thin glass (UTG)). The polarization layer 430 may be a layer that polarizes light such that internal components of the display module 400 are not visually recognized from the outside.

According to various embodiments, as illustrated in FIG. 4B, a first recognition member 460A and a second recognition member 460B of the recognition member 460 may be included. In an embodiment, for example, the recognition member 460 may include a conductive layer for recognizing the movement of a pen input device. A conductive layer may be damaged in a folding or unfolding operation of the electronic device. In an embodiment, the recognition member 460 may include a first recognition member 460A disposed in the first housing 210 and a second recognition member 460B disposed in the second housing 220 such that a damage to the conductive layer in a folding or unfolding operation of the electronic device may be effectively prevented. In an embodiment, the recognition member 460 may include a digitizer.

According to various embodiments, the second support part 470 may include a first portion 470A and a second portion 470B. The first portion 470A may be disposed in the first housing 210, and the second portion 470B may be disposed in the second housing 220. In another embodiment, where the recognition member 460 and the second support part 470 are configured to be foldable, the recognition member 460 and the second support part 470 may be disposed in the first housing 210 and the second housing 220 without being segmented from each other.

According to various embodiments, the display panel 440 may include a substrate 442, and a plurality of light-emitting elements (e.g., oxide light-emitting diodes (OLEDs) or light-emitting diodes (LEDs)) disposed on the substrate 442 and/or transistors (e.g., thin film transistors (TFTs). In an embodiment, the substrate 442 of the display panel 440 may include or be formed of a flexible material (e.g., polyimide (PI), polyethylene terephtalate (PET)) to allow bending of a partial area. The display driving circuit 441 (display driver IC (DDI)) for controlling the driving of the display panel 440 may be disposed on the same substrate 442 as the substrate 442 on which the light-emitting elements are disposed, or may be disposed on a substrate 442 different from the substrate on which the light-emitting elements are disposed and may be electrically connected to the substrate 442 on which the light-emitting elements are disposed. In an embodiment, for example, as illustrated in FIG. 4B, the display driving circuit 441 may be disposed on a portion of the substrate 442 of the display panel 440.

In an embodiment, as illustrated in FIGS. 4A and 4B, the substrate 442 of the display panel 440 may pass through via the side surface of the display module 400. The front surface of the display module 400 may be understood as a surface oriented in the ±Z direction with reference to FIG. 4B, and the rear surface of the display module 400 may be understood as a surface oriented in the −Z direction with reference to FIG. 4B. The side surface of the display module 400 may be understood as other surfaces except for the front and rear surfaces. Since the connection part 490 connected to the printed circuit board 510 of the electronic device disposed under the display panel 440 and the display panel 440 are electrically connected to each other, a signal processed by a processor (e.g., the processor 120 in FIG. 1) of the electronic device may be transmitted to the display panel 440. Here, the term "under" may refer to the −Z direction with reference to FIG. 4B. The connection part 490 may include, for example, a flexible printed circuit board (FPCB). In an embodiment, the printed circuit board 510 of the electronic device may include a first printed circuit board 510A disposed in the first housing 210 and a second printed circuit board 510B disposed in the second housing 220. In an embodiment, as illustrated in FIGS. 4A and 4B, the connection part 490 may be disposed in the first housing 210 to electrically connect the display panel 440 to the first printed circuit board 510A disposed in the first housing 210.

According to various embodiments, the display panel 440 may include a first area 440A disposed in the first housing 210, a second area 440B disposed in the second housing 220, and a third area 440C interconnecting the first area 440A to the second area 440B. In an embodiment, for example, the third area 440C may mean a portion located between the first area 440A and the second area 440B, and may mean an area of the display panel 440 disposed between the first housing 210 and the second housing 220. In FIG. 4B, the first area 440A, the second area 440B, and the third area 440C are illustrated separately for convenience of description. However, in an embodiment, the first area 440A, the second area 440B and the third area 440C may be parts of a continuous area without being visually separated.

In an embodiment, at least a portion of the third area 440C of the display panel 440 may be bent during the folding operation of the first housing 210 and the second housing 220. According to an embodiment, since the portion that is actually bent during the folding operation of the first housing 210 and the second housing 220 is the third area 440C, the substrate 442 of the display panel 440 disposed in the portion of the substrate 442 of the display panel 440 corresponding to the third area 440c may include or be formed of a flexible material, and the substrate 442 of the display panel 440 disposed in the portions corresponding to the first area 440A and the second area 440B may include or be formed of an inflexible material. In another embodiment, the substrate 442 of the display panel 440 disposed in the portions corresponding to the first area 440A, the second area 440B, and the third area 440C may include or be formed of a flexible material.

According to various embodiments, the first support part 450 may be disposed under the display panel 440 to support the display panel 440. The first support part 450 may include a flexible connection part 451. The flexible connection part 451 may include a structure which is at least partially bent. In an embodiment, for example, the portion in the first support part 450 corresponding to the third area 440C of the display panel 440 may be the flexible connection part 451. The flexible connection part 451 may be bent according to the rotation of the second housing 220 relative to the first housing 210. Referring to FIG. 4C, the flexible connection part 451 may include a portion in which a plurality of grooves 451-1 are formed. When the second housing 220 rotates relative to the first housing 210, deformation occurs in the portion in which the plurality of grooves 451-1 are formed so that the first support part 450 may be bent. In an embodiment, for example, the plurality of grooves 451-1 may be arranged in a lattice form. The shape of an embodiment of the flexible connection part 451 is illustrated in FIG. 4C, and alternatively, another structure for bending of the first support part 450 may be included in the first support part 450. In an embodiment, the first support part 450 may include a film including or made of glass or synthetic resin material.

According to various embodiments, the recognition member 460 may be disposed under the first support part 450 (e.g., in the −Z-axis direction). The recognition member 460 may recognize a pen input device approaching the display module 400, and may generate a signal corresponding to a coordinate value of the pen input device as the pen input device moves on the display module 400. In such an embodiment where the recognition member 460 is included in the display module 400, the display module 400 may recognize an input made via the pen input device. In an embodiment, for example, the recognition member 460 may include a conductive layer in which a plurality of conductive lines are formed or defined. A magnetic field may be formed by an AC voltage applied to the conductive layer. As a pen input device having a coil embedded therein approaches, a current flows through an internal circuit of the pen input device due to electromagnetic induction to form a resonance frequency, and the recognition member 460 recognizes the resonance frequency to recognize the movement of the pen input device. The principle of the recognition member 460 recognizing the pen input device as described above is merely an example, and the recognition member 460 may recognize the movement of the pen input device in various ways.

In an embodiment, the recognition member 460 may include a first recognition member 460A and a second recognition member 460B, as illustrated in FIG. 4B. In an embodiment, for example, the first recognition member 460A may be disposed in the first housing 210, and the second recognition member 460B may be disposed in the second housing 220. The first recognition member 460A may correspond to the first area 440A of the display panel 440, and the second recognition member 460B may correspond to the second area 440B of the display panel 440. The input of the pen input device via the first area 440A may be recognized via the first recognition member 460A, and the input of the pen input device via the second area 440B may be recognized through the second recognition member 460B.

According to various embodiments, the first recognition member connection part 461A may electrically connect the first recognition member 460A to the first printed circuit board 510A of the printed circuit board 510. The first recognition member connection part 461A may be electrically connected, at one end thereof, to the first recognition member 460A and may be electrically connected, at the other end thereof, to the first printed circuit board 510A disposed in the first housing 210 by passing through the side surfaces of the components (e.g., the second support part 470 in FIG. 4B) disposed under the first recognition member 460A (e.g., in the −Z-axis direction). A signal generated by the first recognition member 460A may be transmitted to the first printed circuit board 510A via the first recognition member connection part 461A. The first recognition member connection part 461A may pass through the space between a side surface of the display module 400 and the first housing 210 to electrically connect the first printed circuit board 510A disposed under the first recognition member 460A and the first recognition member 460A to each other. In such an embodiment, since the first recognition member connection part 461A extends by sharing the side surfaces of the layers disposed under the first recognition member 460A, holes may be omitted from the components disposed under the first recognition member 460A.

According to various embodiments, the second recognition member connection part 461B may electrically connect the second recognition member 460B to the second printed circuit board 510B. The second recognition member connection part 461B may be electrically connected, at one end thereof, to the second recognition member 460B and may be electrically connected, at the other end thereof, to the second printed circuit board 510B disposed in the second housing 220 by passing through the side surfaces of the components (e.g., the second support part 470 in FIG. 4B) disposed under the second recognition member 460B. A signal generated by the second recognition member 460B may be transmitted to the second printed circuit board 510B via the second recognition member connection part 461B. The second recognition member connection part 461B may pass through the space between a side surface of the display module 400 and the second housing 220 to electrically connect the second printed circuit board 510B disposed under the second recognition member 460B and the second recognition member 460B to each other. In such an embodiment, since the second recognition member connection part 461B extends by sharing the side surfaces of the layers disposed under the second recognition member 460B, holes may be omitted from the components disposed under the second recognition member 460B.

According to various embodiments, the second support part 470 may be disposed under the recognition member 460 to support the recognition member 460. In an embodiment, for example, the second support part 470 may include a first portion 740A disposed in the first housing 210 to support the first recognition member 460A and a second portion 470B disposed in the second housing 220 to support the second recognition member 460B. The second support part 470 may be formed in a plate shape. The second support part 470 may include a conductive material to perform a grounding or shielding function for the display module 400.

According to various embodiments, a first bracket 261 (e.g., the first support member 261 in FIG. 3) may be disposed in the first housing 210. A second bracket 262 (e.g., the second support member 262 in FIG. 3) may be disposed in the second housing 220. The first bracket 261 may support at least some of various components disposed in the first housing 210. In an embodiment, the first bracket 261 may be integrally formed with the first housing 210 as a single unitary body. The second bracket 262 may support at least some of various components disposed in the second housing 220. In an embodiment, the second bracket 262 may be integrally formed with the second housing 220 as a single unitary body.

An electrical signal or electrical interference not related to the operation of the display module 400 may affect the operation of the display module 400. For example, electric charges accumulated in a specific portion of the display module 400 may cause a flicker phenomenon in which the display intermittently flickers. In an embodiment, the display module 400 is desired to be connected to a ground to remove such undesired charges. In the display module 400 according to various embodiments disclosed herein, the second support part 470 may include a conductive material electrically connected to the second printed circuit board 510B to ground the display module 400. Since the second support part 470 is electrically connected to the second printed circuit board 510B, abnormal charges that prevent the normal operation of the display module 400 may be removed via the second support part 470. In an embodiment, for example, the second support part 470 may be electrically connected to a ground included in the second printed circuit board 510B.

According to various embodiments, the first portion 470A of the second support part 470 may be disposed in the first housing 210 to be electrically connected to the connection part 490, which electrically connects the display panel 440 and the first printed circuit board 510A to each other. In such an embodiment where the first portion 470A is electrically connected to the connection part 490, the first portion 470A and the first printed circuit board 510A may be electrically connected to each other. Thus, the first portion 470A of the second support part 470 may be electrically connected to the ground of the first printed circuit board 510A. Referring to FIG. 4B, the first portion 470A and the connection part 490 may be electrically connected to each other by the first contact part 480A disposed between the first portion 470A and the connection part 490. The first contact part 480A may include, for example, a conductive material. In an embodiment, at least a portion of the first contact part 480A may include an adhesive material such as a conductive tape.

According to various embodiments, the second portion 470B of the second support part 470 may be electrically connected to the second recognition member connection part 461B, which electrically connects the second recognition member 460B to the second printed circuit board 510B. Since the second portion 470B is electrically connected to the second recognition member connection part 461B, the second portion 470B may be electrically connected to the ground of the second printed circuit board 510B. The second portion 470B and the second recognition member connection part 461B may be electrically connected to each other by the second contact part 480B disposed between the second portion 470B and the second recognition member connection part 461B. The second contact part 480B may include, for example, a conductive material. In another embodiment, the second contact part 480B may include an elastic material to withstand deformation due to an external force. In an embodiment, as illustrated in FIG. 4B, the second portion 470B is electrically connected to the second recognition member connection part 461B, but the deformation of the surface shape of the display module 400 may be reduced since the second contact part 480B, which include or is formed of an elastic material, may be restored even if it is deformed by an external force.

Referring to FIG. 4B, the second bracket 262 may be disposed under the second portion 470B (e.g., in the −Z direction in FIG. 4B) to support the second portion 470B. In an embodiment, the second contact part 480B may be disposed in a recess 262-1 formed in the second bracket 262. The recess 262-1 may be a groove formed in the second bracket 262 in the −Z direction with reference to FIG. 4B. Since the second contact part 480B is disposed in the recess 262-1 in the second bracket 262, deformation of a portion of the second portion 470B that faces the second contact part 480B may be reduced due to the volume of the second contact part 480B itself. Accordingly, deformation of the surface shape of the display module 400 supported by the second portion 470B may also be reduced.

In various embodiments, since the second portion 470B is electrically connected to the second printed circuit board 510B via the second recognition member connection part 461B for connecting the second recognition member 460B and the second printed circuit board 510B to each other, a separate component or space for electrically connecting the second portion 470B to the second printed circuit board 510B may be omitted.

Figure 5A:
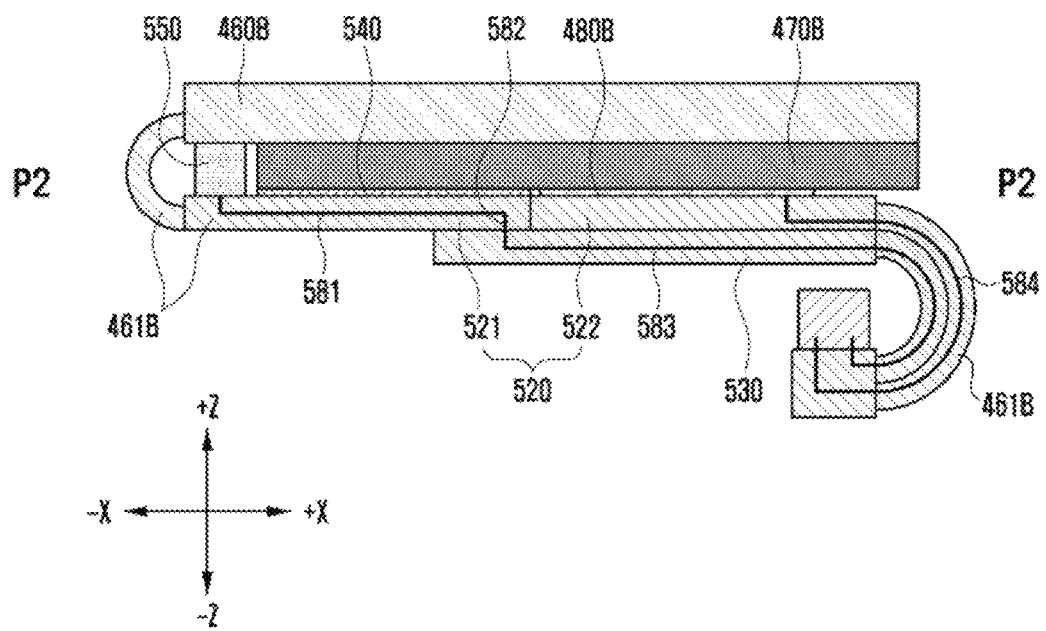
FIG. 5A is a schematic cross-sectional view of the second recognition member connection part 461B and peripheral components thereof taken along line P2-P2 in FIG. 4A.
Figure 5B:
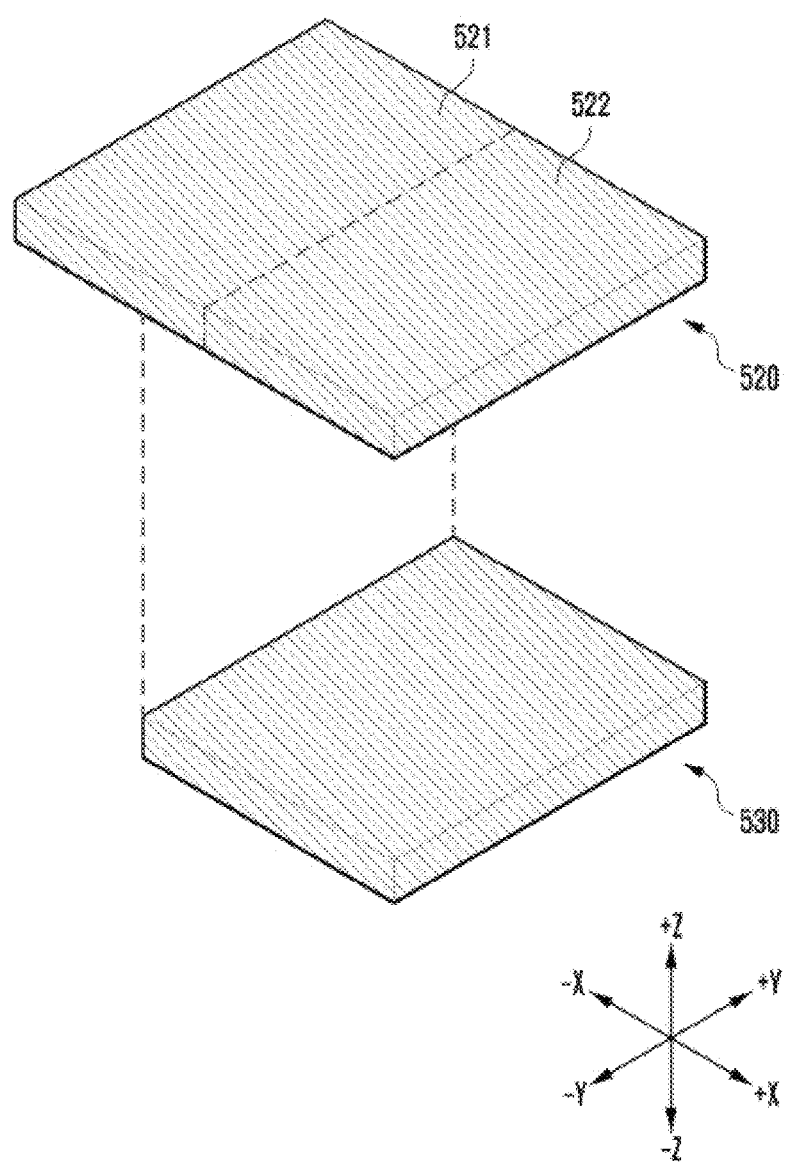
FIG. 5B is a view for describing a layer structure of the second recognition member connection part 461B according to various embodiments disclosed herein.

FIG. 5A is a schematic cross-sectional view of the second recognition member connection part 461B and peripheral components thereof taken along line P2-P2 in FIG. 4A. FIG. 5B is a view for describing a layer structure of the second recognition member connection part 461B according to various embodiments disclosed herein.

According to various embodiments, as illustrated in FIG. 5A, the second portion 470B of the second support part (e.g., the second support part 470 in FIGS. 4A and 4B) may be disposed between the second recognition member 460B and the second recognition member connection part 461B. The second portion 470B and the second recognition member connection part 461B may be electrically connected to each other by the first contact part 480 disposed between the second recognition member connection part 461B and the second portion 470B. Since the second portion 470B is electrically connected to the second recognition member connection part 461B by the first contact part 480 and the second recognition member connection part 461B is electrically connected to the second printed circuit board 510B, the second portion 470B and the second printed circuit board 510B can be electrically connected to each other.

Referring to FIGS. 5A and 5B, the second recognition member connection part 461B, which is in contact with the second portion 470B, may include a plurality of layers. In an embodiment, for example, the second recognition member connection part 461B may include a first layer 520 and a second layer 530. The first layer 520 may be stacked on the second layer 530 as illustrated in FIG. 5A, and another layer may be disposed between the first layer 520 and the second layer 530. In an embodiment, the first layer 520 may include a first zone 521 in which a wiring line 581 for connection to the second recognition member 460B is disposed and a second zone 522 in which a wiring line 584 for connection to the second contact part 480B is disposed. In an embodiment, the second contact part 480B may be disposed between the second zone 522 and the second portion 470B of the first layer 520. The second contact part 480B may electrically connect the wiring line 584 disposed in the second zone 522 of the first layer 520 and the second portion 470B to each other. An insulating layer 540 may be disposed between the first zone 521 and the second portion 470B of the first layer 520. A wiring line 581 for transmitting a signal of the second recognition member 460B may be disposed in the first zone 521 of the first layer 520. The insulating layer 540 disposed between the first zone 521 of the first layer 520 and the second portion 470B may block movement of an electrical signal of the second portion 470B to the first zone 521. Since the second portion 470B and the first zone 521 of the first layer 520 are electrically cut off or insulated by the insulating layer 540, the wiring line 581 disposed in the first zone 521 may transmit the signal of the second recognition member 460B to the second printed circuit board 510B without being affected by the second portion 470B.

According to various embodiments, a wiring line 583 for transmitting a signal of the second recognition member 460B may be disposed on the second layer 530 of the second recognition member connection part 461B. In an embodiment, the second layer 530 may be disposed to be in contact with the first zone 521 and the second zone 522 of the first layer 520. A wiring line 583 for transmitting a signal of the second recognition member 460B may be disposed on the second layer 530. The wiring line 581 disposed in the first zone 521 of the first layer 520 and the wiring line 583 disposed on the second layer 530 may be electrically connected to each other, in an embodiment, for example, a via 582 may be formed in a portion in which the second layer 530 and the first zone 521 are in contact with each other, and the wiring line 581 of the first zone 521 may be electrically connected to the wiring line 583 of the second layer 530 via this via 582.

Referring to FIG. 5B, in the second recognition member connection part 461B, the portion (e.g., the first zone 521 of the first layer 520 and the second layer 530) in which wiring lines (e.g., the wiring lines 581 and 583 in FIG. 5A) connected to the second recognition member 460B are disposed and the portion (e.g., the second zone 522 of the first layer 520) in which a wiring line (e.g., the wiring line 584 in FIG. 5A) connected to the second contact part 480B is disposed may not overlap each other in the +Z direction. In an embodiment, for example, when the second recognition member 460B is viewed in the +Z direction with reference to FIG. 5B, as illustrated in FIG. 5B, the portion in which wiring lines connected to the second recognition member 460B are disposed and wiring lines connected to the second contact 480B are disposed may be disposed in different zones (e.g., the first zone 521 and the second zone 522 of the first layer 520) in a same layer, and may be disposed in different layers (e.g., the second zone 522 in the first layer 520 and the second layer 530) in an overlapping area, such that signal interference may be reduced.

According to various embodiments, as illustrated in FIG. 5A, a bonding member 550 may be disposed between a portion of the second recognition member 460B and a portion of the second recognition member connection part 461B. The bonding member 550 may include a conductive material. The wiring line 581 disposed in the first zone 521 of the first layer 520 may be electrically connected to the second recognition member 460B via the bonding member 550.

Figure 6A:
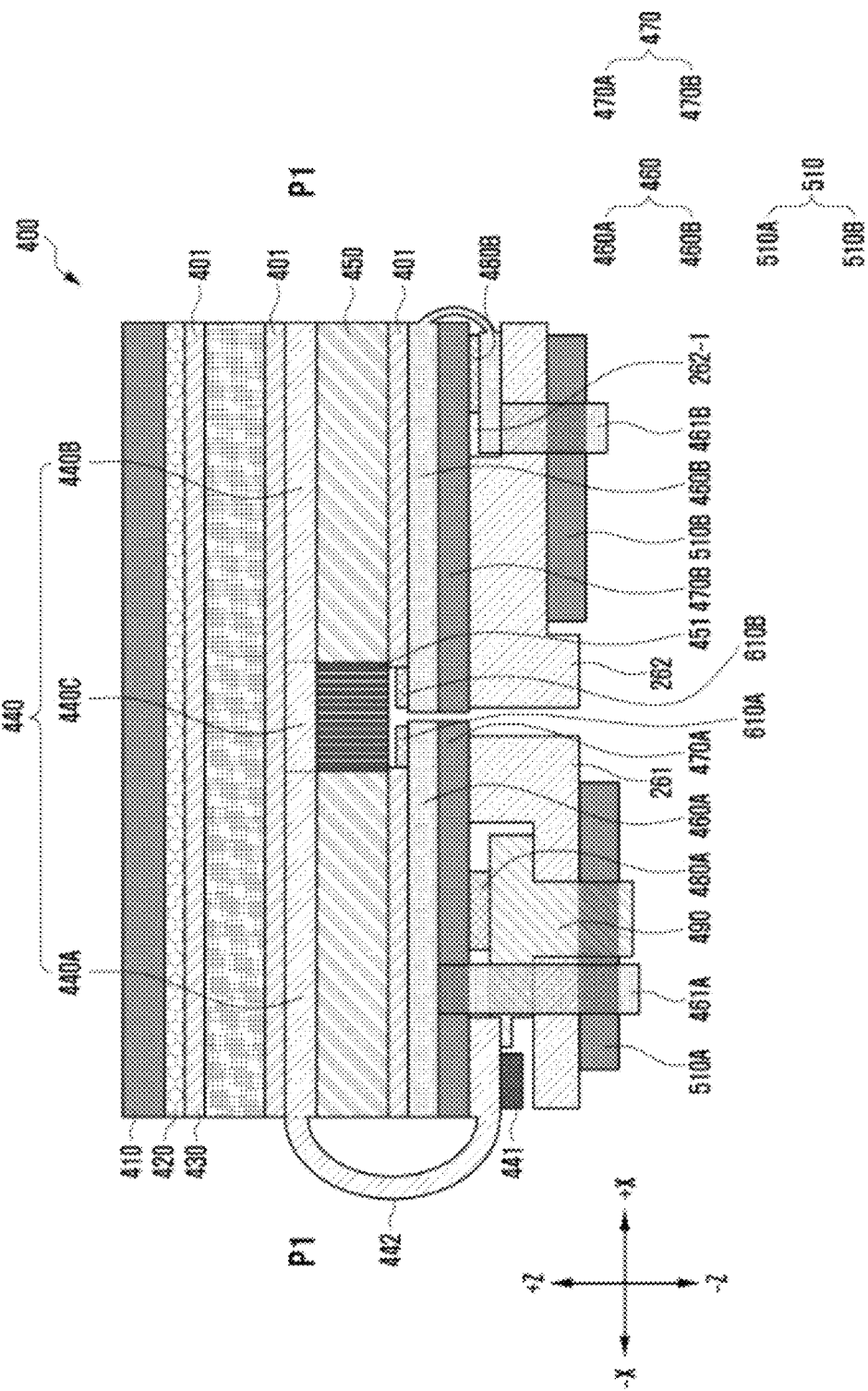
FIG. 6A is a schematic cross-sectional view of a display module according to various embodiments disclosed herein.
Figure 6B:
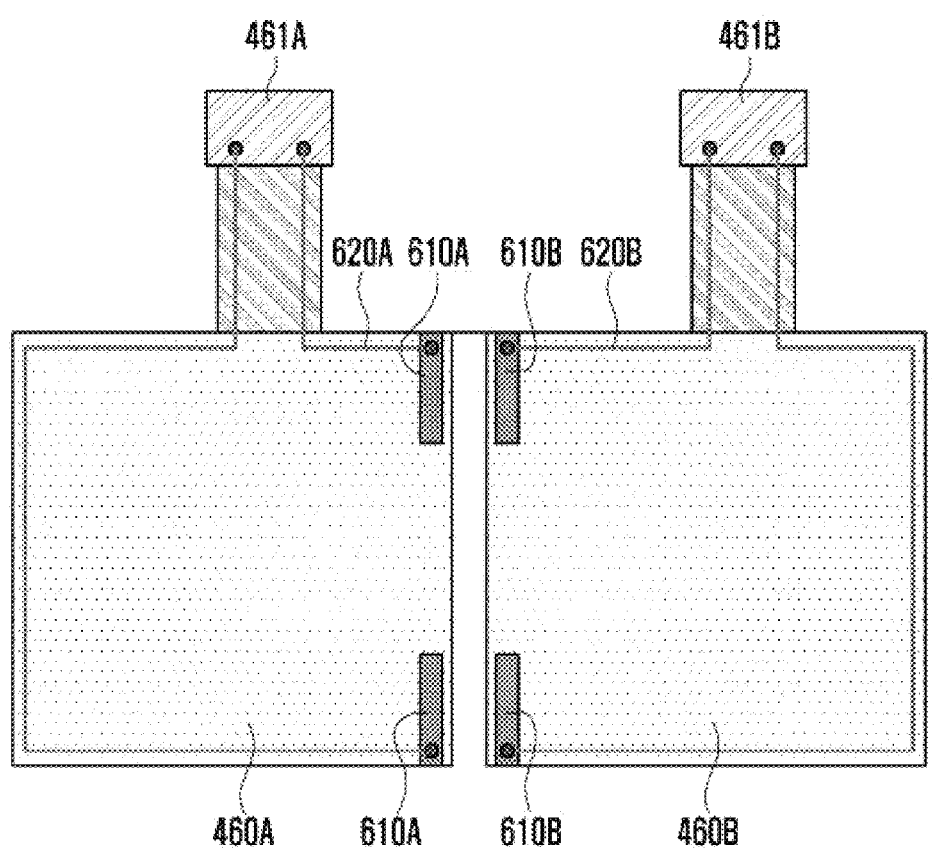
FIG. 6B is a schematic view illustrating an electrical connection relationship between the recognition member and the second contact part illustrated in FIG. 6A.
Figure 6C:
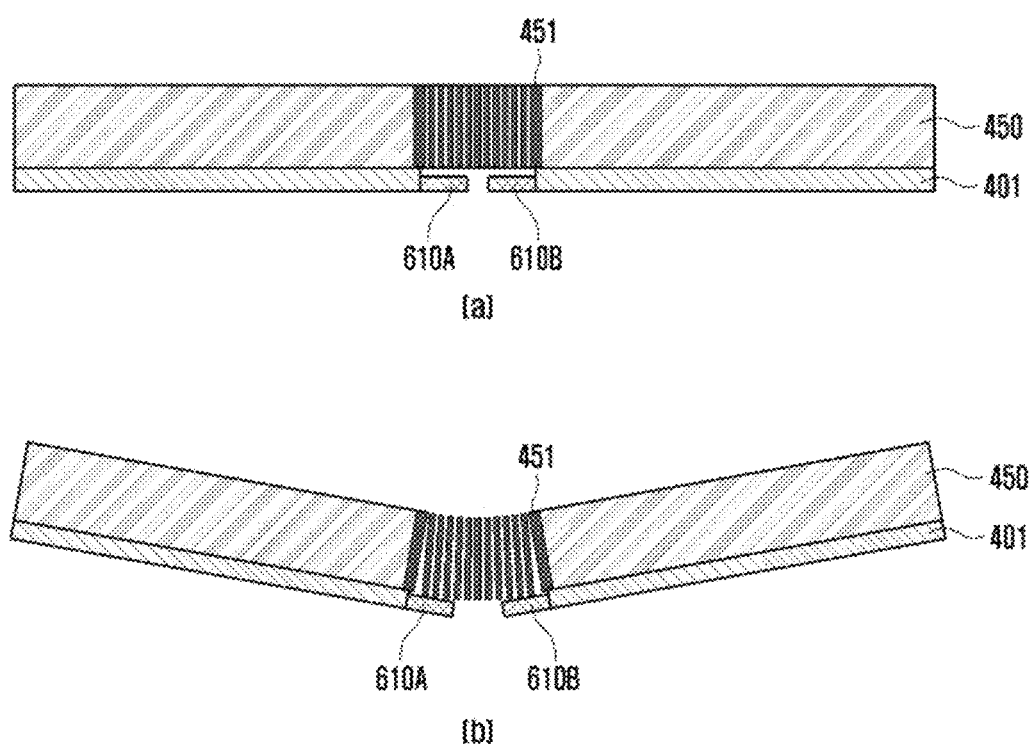
FIG. 6C is a view for describing a contact relationship between the second contact part and the flexible connection part according to folding of an electronic device according to various embodiments of the disclosure.

FIG. 6A is a schematic cross-sectional view of a display module according to various embodiments disclosed herein. FIG. 6B is a schematic view illustrating an electrical connection relationship between the recognition member and the second contact part illustrated in FIG. 6A. FIG. 6C is a view for describing a contact relationship between the second contact part and the flexible connection part according to folding of an electronic device according to various embodiments of the disclosure. FIG. 6A may be a schematic cross-sectional view of the electronic device taken along line P1-P1 in FIG. 2A.

The embodiment described with reference to FIGS. 6A and 6B may be similar to the embodiment described above with reference to FIG. 4B. In the following description, the same reference numerals are used for the components that are the same as or similar to those described with reference to FIG. 4B. In addition, any repetitive detailed description of the same or similar elements as those described with reference to FIG. 4B will be omitted, and differences will be mainly described.

According to various embodiments, a third contact part 610A may be disposed in the upper portion (or the upper surface) of the first recognition member 460A (e.g., in the +Z-axis direction), and a fourth contact part 610B may be disposed in the upper portion of the second recognition member 460B. Referring to FIG. 6A, the third contact part 610A is disposed between the first support part 450 and the first recognition member 460A, and the fourth contact part 610B may be disposed between the first support part 450 and the second recognition member 460B. The third contact part 610A may be disposed in the upper portion of the first recognition member 460A at a position facing the flexible connection part 451 of the first support part 450. The fourth contact part 610B may be disposed in the upper portion of the second recognition member 460B at a position facing the flexible connection part 451 of the first support part 450. The third contact part 610A and the fourth contact part 610B may include, for example, a conductive material. In an embodiment, the third contact part 610A and the fourth contact part 610B may include substantially a same material as the first contact part 480A and the second contact part 480B described above. In an embodiment, for example, at least a portion of the third contact part 610A and the fourth contact part 610B may include an adhesive material such as a conductive tape.

In an embodiment, the first support part 450 may include glass, a film, or a conductive member, and the flexible connection part 451 of the first support part 450 may include a conductive material. According to various embodiments, the flexible connection part 451 may include a conductive material, and when the electronic device is in the folded state or the intermediate state, the flexible connection part 451 may be electrically connected to the printed circuit board 510 of the electronic device. In an embodiment, for example, when the electronic device is in the folded state or the intermediate state, the flexible connection part 451 may be electrically connected to the ground of the printed circuit board 510 by the third contact part 610A and the fourth contact part 610B.

According to various embodiments, the third contact part 610A may be disposed in the upper portion of the first recognition member 460A (e.g., in the +Z-axis direction) to be electrically connected to the first recognition member connection part 461A via the wiring line 620A included in the first recognition member 460A. The fourth contact part 610B may be disposed in the upper portion of the second recognition member 460B (e.g., in the +Z-axis direction) to be electrically connected to the second recognition member connection part 461B via the wiring line 620B included in the second recognition member 460B. Since the first recognition member connection part 461A is electrically connected to the first printed circuit board 510A and the second recognition member connection part 461B is electrically connected to the second printed circuit board 510B, the third contact part 610A may be electrically connected to the first printed circuit board 510A, and the fourth contact part 610B may be electrically connected to the second printed circuit board 510B. In an embodiment, for example, when the electronic device is in the folded state or the intermediate state, the flexible connection part 451 of the first support part 450 comes into contact with the third contact part 610A and/or the fourth contact part 610B such that the first support part 450 and the printed circuit board 510 may be electrically connected to each other. In an embodiment, one of the third contact part 610A and the fourth contact part 610B may be omitted.

According to various embodiments, the height of the third contact part 610A and/or the fourth contact part 610B may be adjusted to be in contact with the flexible connection part 451 when the flexible connection part 451 is deformed. The flexible connection part 451 may be deformed when the second housing 220 of the electronic device rotates relative to the first housing 210. As illustrated in (a) of FIG. 6C, when the flexible connection part 451 is not deformed, the third contact part 610A and/or the fourth contact part 610B may be spaced apart from the flexible connection part 451, and thus the third contact part 610A and/or the fourth contact part 610B may not come into contact with the flexible connection part 451. As illustrated in (b) of FIG. 6C, when the electronic device is in the folded state or the intermediate state, when the flexible connection part 451 is deformed, the third contact part 610A and/or the fourth contact part 610B may come into contact with the flexible connection part 451. In such a state, the flexible connection part 451 may be electrically connected to the printed circuit board 510 via the third contact part 610A and/or the fourth contact part 610B. The charges accumulated in the flexible connection part 451 may be moved to the printed circuit board 510 through contact with the third contact part 610A and/or the fourth contact part 610B. Accordingly, an undesired phenomenon (e.g., flicker) due to abnormal charge accumulation in the flexible connection part 451 may be reduced.

Figure 7B:
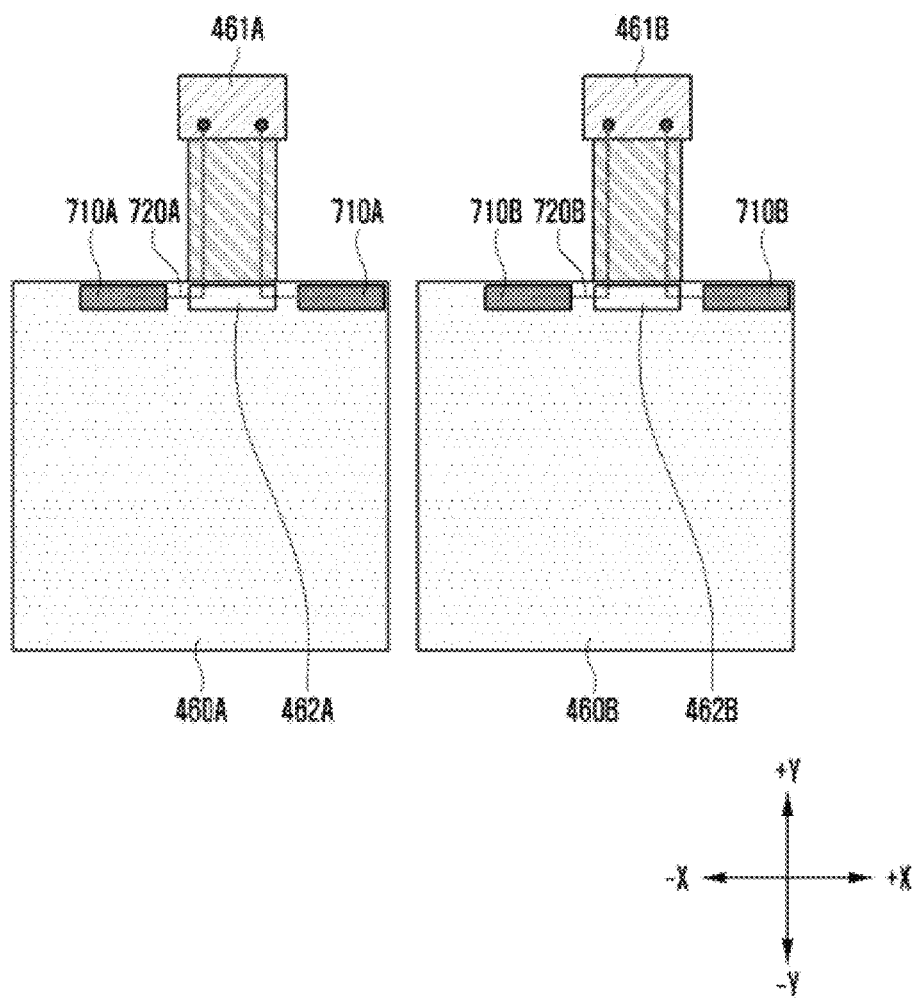
FIG. 7B is a schematic view illustrating an electrical connection relationship between the recognition member and the third contact part illustrated in FIG. 7A.

FIG. 7A is a schematic cross-sectional view of a display module according to various embodiments disclosed herein. FIG. 7B is a schematic view illustrating an electrical connection relationship between the recognition member and the third contact part illustrated in FIG. 7A. FIG. 7A may be a schematic cross-sectional view of the electronic device taken along line P1-P1 in FIG. 2A.

The embodiment described with reference to FIGS. 7A and 7B may be similar to the embodiment described above with reference to FIG. 4B. In the following description, the same reference numerals are used for the same or similar components as those described with reference to FIG. 4B. In addition, any repetitive detailed description of the same or similar elements as those described with reference to FIG. 4B will be omitted, and differences will be described.

According to various embodiments, the first support part 450 may include a conductive member. In an embodiment, for example, a portion of the first support part 450 other than the flexible connection part 451 may include or be formed of a conductive member. In such an embodiment, the flexible connection part 451 may include a conductive member or a non-conductive member. In another embodiment, the entire first support part 450 may include or be formed of a conductive member.

According to various embodiments, a fifth contact part 710A may be disposed in the upper portion of the first recognition member 460A (e.g., in the +Z-axis direction). A sixth contact part 710B may be disposed in the upper portion of the second recognition member 460B. Referring to FIG. 7A, the fifth contact part 710A may be disposed between the first support part 450 and the first recognition member 460A. The sixth contact part 710B may be disposed between the first support part 450 and the second recognition member 460B. In an embodiment, for example, the fifth contact part 710A may be disposed adjacent to an edge of the first recognition member 460A, and the sixth contact part 710B may be disposed adjacent to an edge of the second recognition member 460B. In another embodiment, at least a portion of the fifth contact part 710A may be disposed between the first support part 450 and the first recognition member 460A not to overlap the flexible connection part 451 when viewed in the +Z-axis direction of FIG. 7A, and at least a portion of the sixth contact part 710B may be disposed between the first support part 450 and the second recognition member 460B not to overlap the flexible connection part 451 when viewed in the +Z-axis direction of FIG. 7A. In an embodiment, the fifth contact part 710A may be disposed adjacent to the edge of the first recognition member 460A at a position adjacent to the first recognition member connection part 461A electrically connected to the first recognition member 460A. The sixth contact part 710B may be disposed adjacent to the edge of the second recognition member 460B at a position adjacent to the second recognition member connection part 461B electrically connected to the second recognition member 460B. A portion of the recognition member 460 adjacent to the first recognition member connection part 461A or the second recognition member connection part 461B may be a portion having a relatively low density of wiring lines for recognizing the pen input device compared to other portions. As described above, the fifth contact part 710A may be disposed at a position adjacent to the first recognition member connection part 461A so that the fifth contact part 710A and the sixth contact part 710B may be disposed in a portion in which the density of wiring lines is low, and the sixth contact part 710B may be disposed adjacent to the second recognition member connection part 461B. The fifth contact part 710A and the sixth contact part 710B may include, for example, a conductive material. In an embodiment, the fifth contact part 710A and the sixth contact part 710B may include or be formed of substantially a same material as the above-described second contact part 480B. In an embodiment, for example, at least a portion of the fifth contact part 710A and the sixth contact part 710B may include an adhesive material such as a conductive tape. In an embodiment, one of the fifth contact part 710A and the sixth contact part 710B may be omitted.

Referring to FIG. 7B, a first bonding area 462A may be located in a portion in which the first recognition member 460A and the first recognition member connection part 461A are connected to each other, and a second area 462B may be located in a portion in which the second recognition member 460B and the second recognition member connection part 461B are connected to each other. In an embodiment, the recognition member 460 and the recognition member connection parts 461A and 461B may be bonded to each other via an anisotropic conductive film (ACF). In such an embodiment, the first bonding area 462A and the second bonding area 462B may be understood as areas in which the ACF is disposed. The fifth contact part 710A may be disposed adjacent to the first bonding area 462A, and the sixth contact part 710B may be disposed adjacent to the second bonding area 462B. In an embodiment, for example, as illustrated in FIG. 7B, the fifth contact part 710A may be disposed in a horizontal direction (e.g., in the X-axis direction in FIG. 7B) relative to the first bonding area 462A, and the sixth contact part 710B may be disposed in a horizontal direction relative to the second bonding area 462B. Here, the direction horizontal relative to the first bonding area 462A and the second bonding area 462B may be understood as a direction perpendicular to the extension direction of the first recognition member connection part 461A and the second recognition member connection part 461B (e.g., the Y-axis direction in FIG. 7B). In a direction horizontal to portions (e.g., the bonding areas 462A and 462B) adjacent to the bonding areas 462A and 462B (e.g., in the X-axis direction in FIG. 7), conductive wiring lines for recognizing the pen input device may not be present, and may thus be desired to dispose the fifth contact part 710A and 710B in such a direction.

According to various embodiments, the fifth contact part 710A may be disposed in the upper portion of the first recognition member 460A to be electrically connected to the first recognition member connection part 461A via a wiring line 720A included in the first recognition member 460A. The sixth contact part 710B may be disposed in the upper portion of the second recognition member 460B to be electrically connected to the second recognition member connection part 461B via a wiring line 720B included in the second recognition member 460B. Since the first recognition member connection part 461A is electrically connected to the first printed circuit board 510A, and the second recognition member connection part 461B is electrically connected to the second printed circuit board 510B, the fifth contact part 710A and/or the sixth contact part 710B may be electrically connected to the first printed circuit board 510A or the second printed circuit board 510B. When the first support part 450 comes into contact with the fifth contact part 710A and/or the sixth contact part 710B, the first support part 450 and the printed circuit board 510 may be electrically connected to each other.

According to various embodiments, the fifth contact part 710A and/or the sixth contact part 710B may come into contact with the first support part 450 including or formed of a conductive material. When the first support part 450 comes into contact with the fifth contact part 710A and/or the sixth contact part 710B, the first support part 450 may be electrically connected to the fifth contact part 710A and/or the sixth contact part 710B. The fifth contact part 710A and the sixth contact part 710B may be respectively connected to the first recognition member connection part 461A and the second recognition member connection part 461B to be electrically connected to the printed circuit board 510. The first support part 450 electrically connected to the fifth contact part 710A and/or the sixth contact part 710B may be electrically connected to the ground of the printed circuit board 510.

An electronic device according to various embodiments disclosed herein may include a first housing (e.g., the first housing 210 in FIG. 3), a second housing rotatably connected to the first housing (e.g., the second housing 220 in FIG. 3), a display panel (e.g., the display module 400 in FIG. 4B) including a first area (e.g., the first area 440A in FIG. 4B) included in the first housing, a second area (e.g., the second area 440B in FIG. 4B) disposed in the second housing, and a third area (e.g., the third area 440C in FIG. 4B) which connects the first area and the second area and is at least partially bendable, a first support part (e.g., the first support part 450 in FIG. 4B) disposed under the display panel to support the display panel, a recognition member (e.g., the recognition member 460 in FIG. 4B) which recognizes a signal of a pen input device, where the recognition member includes a first recognition member (e.g., the first recognition member 460A in FIG. 4B) disposed in the first housing under the first support part, and a second recognition member (e.g., the second recognition member 460B in FIG. 4B) disposed in the second housing under the first support part, a second support part (e.g., the second support part 470 in FIG. 4B) including a first portion (e.g., the first portion 470A in FIG. 4B) disposed in the first housing under the recognition member, and a second portion (e.g., the second portion 470B in FIG. 4B) spaced apart from the first portion and disposed in the second housing under the recognition member, a first printed circuit board (e.g., the first printed circuit board 510A in FIG. 4B) disposed in the first housing under the second support part, a second printed circuit board (e.g., the second printed circuit board 510B in FIG. 4B) disposed in the second housing under the second support part, a connection part (e.g., a connection part 490 in FIG. 4B) electrically connecting the display panel and the first printed circuit board to each other and disposed in the first housing, a first recognition member connection part (e.g., the first recognition member connection part 461A in FIG. 4B) electrically connecting the first recognition member and the first printed circuit board to each other and disposed in the first housing, a second recognition member connection part (e.g., the second recognition member connection part 461B in FIG. 4B) electrically connecting the second recognition member and the second printed circuit board to each other and disposed in the second housing, a first contact part (e.g., the first contact part 480A in FIG. 4B) disposed between the first portion of the second support part and the connection part to electrically connect the first portion of the second support part and the connection part to each other, and a second contact part (e.g., the second contact part 480B in FIG. 4B) disposed between the second portion of the second support part and the second recognition member connection part to electrically connect the second portion of the second support part and the second recognition member connection part to each other.

In such embodiments, the second portion of the second support part may be formed in a plate shape and disposed such that a front surface thereof comes into contact with the second recognition member and a rear surface thereof faces the second printed circuit board, and at least a portion of the second recognition member connection part may pass through a side surface of the second portion of the second support part.

In such embodiments, the second contact part may be disposed between the rear surface of the second portion of the second support part and the second recognition member connection part.

In such embodiments, the second contact part may include a conductive material and at least a portion of the second contact part may have an adhesive property.

In such embodiments, the second recognition member connection part may include a first layer (e.g., the first layer 520 in FIG. 5A) and a second layer (e.g., the second layer 530 in FIG. 5A), and the first layer of the second recognition member connection part may include a first zone (e.g., the first zone 521 in FIG. 5A) in which a wiring line for connection to the second recognition member is disposed and a second zone (e.g., the second zone 522 in FIG. 5A) in which a wiring line for connection to the second contact part is disposed.

In such embodiments, the second contact part may be disposed between the second zone of the first layer of the second recognition member connection part and the second portion of the second support part, and the electronic device may further include an insulating layer (e.g., the insulating layer 540 in FIG. 5A) which insulates the first zone of the first layer of the second recognition member connection part and the second portion of the second support part from each other.

In such embodiments, the first support part may include a flexible connection part (e.g., the flexible connection part 451 in FIG. 4B) facing the third area of the display panel, where a plurality of grooves are defined in the flexible connection part, and the electronic device may further include a third contact part (e.g., the third contact part 610A in FIG. 6A) disposed in an upper portion of the first recognition member at a position facing the flexible connection part of the first support part and electrically connected to the first recognition member connection part, and a fourth contact part (e.g., the connection contact part 610B in FIG. 6A) disposed in an upper portion of the second recognition member at a position facing the flexible connection part of the first support part and electrically connected to the second recognition member connection part.

In such embodiments, the third contact part and the fourth contact part may come into contact with the flexible connection part by bending of the flexible connection part of the first support part.

In such embodiments, the first support part may include a conductive material, and the electronic device may further include a fifth contact part (e.g., the fifth contact part 710A in FIG. 7A) disposed between the first support part and the first recognition member adjacent to an edge of the first recognition member and electrically connected to the first recognition member connection part, and a sixth contact part (e.g., the sixth contact part 710B in FIG. 7A) disposed between the first support part and the second recognition member adjacent to an edge of the second recognition member and electrically connected to the second recognition member connection part.

In such embodiments, with respect to the first recognition member connection part, the fifth contact part may be disposed adjacent to the first recognition member connection part at a position perpendicular to an extension direction of the first recognition member connection part, and with respect to the second recognition member connection part, the sixth contact part may be disposed adjacent to the second recognition member connection part at a position perpendicular to an extension direction of the second recognition member connection part.

A display module (e.g., the display module 400 in FIG. 4B) according to various embodiments disclosed herein may include a display panel (e.g., the display panel 440 in FIG. 4B) including a first area (e.g., the first area 440A in FIG. 4B), a second area (e.g., the second area 440B in FIG. 4B), and a third area (e.g., the third area 440*c* in FIG. 4B) connecting the first area and the second area to each other and formed to be at least partially bendable, a first support part (e.g., the first support part 450 in FIG. 4B) disposed under the display panel to support the display panel, a recognition member (e.g., the recognition member 460 in FIG. 4B) including a first recognition member (e.g., the first recognition member 460A in FIG. 4B) disposed under the first support part, and a second recognition member (e.g., the second recognition member 460B in FIG. 4B) spaced apart from the first recognition member and disposed under the first support part, where the recognition member recognizes a signal of a pen input device, a second support part (e.g., the second support part 470 in FIG. 4B) including a first portion (e.g., the first portion 470A in FIG. 4B) disposed under the recognition member, and a second portion (e.g., the second portion 470B in FIG. 4B) spaced apart from the first portion and disposed under the recognition member, a connection part (e.g., the connection part 490 in FIG. 4B) electrically connecting the display panel and the first printed circuit board (e.g., the first printed circuit board 510A in FIG. 4B), a first recognition member connection part (e.g., the first recognition member connection part 461A of FIG. 4B) electrically connecting the first recognition member and a first printed circuit board to each other, a second recognition member connection part (e.g., the second recognition member connection part 461B in FIG. 4B) electrically connecting the second recognition member and a second printed circuit board (e.g., the second printed circuit board 510B in FIG. 4B) spaced apart from the first printed circuit board, a first contact part (e.g., the first contact part 480A in FIG. 4B) disposed between the first portion of the second support part and the connection part to electrically connect the first portion of the second support part and the connection part to each other, and a second contact part (e.g., the second contact part 480B in FIG. 4B) disposed between the second portion of the second support part and the second recognition member connection part to electrically connect the second portion of the second support part and the second recognition member connection part to each other.

In such embodiments, the second portion of the second support part may be in a plate shape and disposed in a way such that a front surface thereof is in contact with the second recognition member and a rear surface thereof is disposed to face the second printed circuit board, and at least a portion of the second recognition member connection part may pass through a side surface of the second portion of the second support part.

In such embodiments, the second contact part may be disposed between the rear surface of the second portion of the second support part and the second recognition member connection part.

In such embodiments, the second contact part may include a conductive material and at least a portion of the second contact part may have an adhesive property.

In such embodiments, the second recognition member connection part may include a first layer (e.g., the first layer 520 in FIG. 5A) and a second layer (e.g., the second layer 530 in FIG. 5A), and the first layer of the second recognition member connection part may include a first zone (e.g., the first zone 521 in FIG. 5A) in which a wiring line for connection to the second recognition member is disposed and a second zone (e.g., the second zone 522 in FIG. 5A) in which a wiring line for connection to the first contact part is disposed.

In such embodiments, the second contact part may be disposed between the second zone of the first layer of the second recognition member connection part and the second portion of the second support part, and the display module may further include an insulating layer (e.g., the insulating layer 540 in FIG. 5A) which insulates the first zone of the first layer of the second recognition member connection part and the second portion of the second support part from each other.

In such embodiments, the first support part may include a flexible connection part (e.g., the flexible connection part 451 in FIG. 4B) in which a plurality of grooves are formed such that a portion facing the third area of the display panel can be bent, and the display module may further include a third contact part (e.g., the third contact part 610A in FIG. 6A) disposed in an upper portion of the first recognition member at a position facing the flexible connection part of the first support part and electrically connected to the first recognition member connection part, and a fourth contact part (e.g., the fourth contact part 610B in FIG. 6A) disposed in an upper portion of the second recognition member at a position facing the flexible connection part of the first support part and electrically connected to the second recognition member connection part.

In such embodiments, the third contact part and the fourth contact part may come into contact with the flexible connection part when the flexible connection part of the first support part is bent.

In such embodiments, the display module may further include a fifth contact part (e.g., the fifth contact part 710A in FIG. 7A) disposed between the first support part and the first recognition member adjacent to an edge of the first recognition member and electrically connected to the first recognition member connection part, and a sixth contact part (e.g., the sixth contact part 710B in FIG. 7A) disposed between the first support part and the second recognition member adjacent to an edge of the second recognition member and electrically connected to the second recognition member connection part.

In such embodiments, with respect to the first recognition member connection part, the fifth contact part may be disposed adjacent to the first recognition member connection part at a position perpendicular to an extension direction of the first recognition member connection part, and with respect to the second recognition member connection part, the sixth contact part may be disposed adjacent to the second recognition member connection part at a position perpendicular to an extension direction of the second recognition member connection part.

The embodiments disclosed in the specification and drawings are provided merely to easily describe the technical features of the disclosure according to the embodiments disclosed herein and to help understanding of the embodiments disclosed herein, and are not intended to limit the scope of the disclosure. Therefore, the scope of the various embodiments disclosed herein should be construed in such a manner that, in addition to the embodiments disclosed herein, all changes or modifications derived from the technical idea of the various embodiments are included in the scope of the various embodiments disclosed herein.

DESCRIPTION OF REFERENCE NUMERALS

210: first housing, 220: second housing, 400: display module, 410: protective layer, 420: glass layer, 430: polarizing layer, 440: display panel, 450: first support part, 460: recognition member, 470: second support part.

The invention claimed is:

1. An electronic device comprising:
a first housing;
a second housing rotatably connected to the first housing;
a display panel including a first area disposed in the first housing, a second area disposed in the second housing, and a third area which connects the first area and the second area and is at least partially bendable;
a first support part disposed under the display panel to support the display panel;
a recognition member which recognizes a signal of a pen input device, wherein the recognition member includes a first recognition member disposed in the first housing under the first support part, and a second recognition member disposed in the second housing under the first support part;
a second support part including a first portion disposed in the first housing under the recognition member, and a second portion spaced apart from the first portion and disposed in the second housing under the recognition member;
a first printed circuit board electrically connected to the display panel and the first recognition member, wherein the first portion of the second support part is electrically connected to the first printed circuit board; and
a second printed circuit board spaced apart from the first printed circuit board and electrically connected to the second recognition member, wherein the second portion of the second support part is electrically connected to the second printed circuit board.

2. The electronic device of claim 1, further comprising:
a connection part electrically connecting the display panel and the first printed circuit board to each other and disposed in the first housing;
a first recognition member connection part electrically connecting the first recognition member and the first printed circuit board to each other and disposed in the first housing;
a second recognition member connection part electrically connecting the second recognition member and the second printed circuit board to each other and disposed in the second housing;
a first contact part disposed between the first portion of the second support part and the connection part to electrically connect the first portion of the second support part and the connection part to each other; and
a second contact part disposed between the second portion of the second support part and the second recognition member connection part to electrically connect the second portion of the second support part and the second recognition member connection part to each other.

3. The electronic device of claim 2, wherein
the second portion of the second support part is in a plate shape and disposed in a way such that a front surface thereof is in contact with the second recognition member and a rear surface thereof is disposed to face the second printed circuit board, and
at least a portion of the second recognition member connection part passes through a side surface of the second portion of the second support part.

4. The electronic device of claim 2, wherein the second contact part is disposed between the rear surface of the second portion of the second support part and the second recognition member connection part.

5. The electronic device of claim 2, wherein
the second contact part includes a conductive material, and
at least a portion of the second contact part has an adhesive property.

6. The electronic device of claim 2, wherein
the second recognition member connection part includes a first layer and a second layer, and
the first layer of the second recognition member connection part includes a first zone in which a wiring line for connection to the second recognition member is disposed and a second zone in which a wiring line for connection to the second contact part is disposed.

7. The electronic device of claim 6, wherein
the second contact part is disposed between the second zone of the first layer of the second recognition member connection part and the second portion of the second support part, and
the electronic device further comprises:
an insulating layer which insulates the first zone of the first layer of the second recognition member connection part and the second portion of the second support part from each other.

8. The electronic device of claim 2, wherein
the first support part includes a flexible connection part facing the third area of the display panel, wherein a plurality of grooves are defined on the flexible connection part, and
the electronic device further comprises:
a third contact part disposed in an upper portion of the first recognition member at a position facing the flexible connection part of the first support part and electrically connected to the first recognition member connection part; and
a fourth contact part disposed in an upper portion of the second recognition member at a position facing the flexible connection part of the first support part and electrically connected to the second recognition member connection part.

9. The electronic device of claim 8, wherein the third contact part and the fourth contact part come into contact with the flexible connection part by bending of the flexible connection part of the first support part.

10. The electronic device of claim 2, wherein
the first support part includes a conductive material, and
the electronic device further comprises:
a fifth contact part disposed between the first support part and the first recognition member adjacent to an edge of the first recognition member and electrically connected to the first recognition member connection part; and
a sixth contact part disposed between the first support part and the second recognition member adjacent to an edge of the second recognition member and electrically connected to the second recognition member connection part.

11. The electronic device of claim 10, wherein
the fifth contact part is disposed adjacent to the first recognition member connection part at a position perpendicular to an extension direction of the first recognition member connection part, and
the sixth contact part is disposed adjacent to the second recognition member connection part at a position perpendicular to an extension direction of the second recognition member connection part.

12. A display module comprising:
a display panel including a first area, a second area, and a third area connecting the first area and the second area to each other and at least partially bendable;
a first support part disposed under the display panel to support the display panel;
a recognition member including a first recognition member disposed under the first support part, and a second recognition member spaced apart from the first recognition member and disposed under the first support part, wherein the recognition member recognizes a signal of a pen input device;
a second support part including a first portion disposed under the recognition member, and a second portion spaced apart from the first portion and disposed under the recognition member;
a connection part electrically connecting the display panel and a first printed circuit board;
a first recognition member connection part electrically connecting the first recognition member and the first printed circuit board to each other;
a second recognition member connection part electrically connecting the second recognition member and a second printed circuit board to each other, wherein the second printed circuit board is spaced apart from the first printed circuit board;
a first contact part disposed between the first portion of the second support part and the connection part to electrically connect the first portion of the second support part and the connection part to each other; and
a second contact part disposed between the second portion of the second support part and the second recognition member connection part to electrically connect the second portion of the second support part and the second recognition member connection part to each other.

13. The display module of claim 12, wherein
the second portion of the second support part is in a plate shape and disposed in a way such that a front surface thereof is in contact with the second recognition member and a rear surface thereof is disposed to face the second printed circuit board, and
at least a portion of the second recognition member connection part passes through a side surface of the second portion of the second support part.

14. The display module of claim 12, wherein the second contact part is disposed between the rear surface of the second portion of the second support part and the second recognition member connection part, wherein the second contact part includes a conductive material, and at least a portion of the second contact part has an adhesive property.

15. The display module of claim 12, wherein
the second recognition member connection part includes a first layer and a second layer, and
the first layer of the second recognition member connection part includes a first zone in which a wiring line for connection to the second recognition member is disposed and a second zone in which a wiring line for connection to the first contact part is disposed.

16. The display module of claim 15, wherein
the second contact part is disposed between the second zone of the first layer of the second recognition member connection part and the second portion of the second support part, and
the display module further comprises:
an insulating layer which insulates the first zone of the first layer of the second recognition member connection part and the second portion of the second support part from each other.

17. The display module of claim 12, wherein
the first support part includes a flexible connection part facing the third area of the display panel, wherein a plurality of grooves are defined in the flexible connection part, and
the display module comprises:
a third contact part disposed in an upper portion of the first recognition member at a position facing the flexible connection part of the first support part and electrically connected to the first recognition member connection part; and
a fourth contact part disposed in an upper portion of the second recognition member at a position facing the flexible connection part of the first support part and electrically connected to the second recognition member connection part.

18. The display module of claim 17, w % herein the third contact part and the fourth contact part come into contact with the flexible connection part by bending of the flexible connection part of the first support part.

19. The display module of claim 11, further comprising:
a fifth contact part disposed between the first support part and the first recognition member adjacent to an edge of the first recognition member and electrically connected to the first recognition member connection part; and
a sixth contact part disposed between the first support part and the second recognition member adjacent to an edge of the second recognition member and electrically connected to the second recognition member connection part.

20. The display module of claim 19, wherein
the fifth contact part is disposed adjacent to the first recognition member connection part at a position perpendicular to an extension direction of the first recognition member connection part, and
the sixth contact part is disposed adjacent to the second recognition member connection part at a position perpendicular to an extension direction of the second recognition member connection part.

* * * * *